(12) United States Patent
Gohl et al.

(10) Patent No.: US 6,212,666 B1
(45) Date of Patent: *Apr. 3, 2001

(54) GRAPHIC REPRESENTATION OF CIRCUIT ANALYSIS FOR CIRCUIT DESIGN AND TIMING PERFORMANCE EVALUATION

(75) Inventors: Karl W. Gohl, Los Altos; Ross A. Donelly, Sunnyvale; Helmut Hissen, Palo Alto, all of CA (US)

(73) Assignee: Synopsys, Inc., Mountain View, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/743,488

(22) Filed: Nov. 4, 1996

(51) Int. Cl.[7] .................................................... G06F 17/50
(52) U.S. Cl. ........................................ 716/6; 716/5; 716/1
(58) Field of Search ................... 364/488–491, 364/578; 716/2, 3, 4, 5, 6

(56) References Cited

U.S. PATENT DOCUMENTS

| | | | |
|---|---|---|---|
| 5,392,221 | * | 2/1995 | Donath et al. ........................ 716/6 |
| 5,508,937 | * | 4/1996 | Abano et al. ......................... 364/488 |
| 5,535,145 | * | 7/1996 | Hathawath ........................... 364/578 |
| 5,648,913 | * | 7/1997 | Bennett et al. ....................... 364/491 |
| 5,659,484 | * | 8/1997 | Bennett et al. ....................... 364/491 |
| 5,719,783 | * | 2/1998 | Kerzman et al. ..................... 364/488 |
| 5,724,250 | * | 3/1998 | Kerzman et al. ..................... 364/488 |
| 5,726,903 | * | 3/1998 | Kerzman et al. ..................... 364/489 |
| 5,796,621 | * | 8/1998 | Dudley et al. ....................... 364/489 |
| 5,812,416 | * | 9/1998 | Gupte et al. ......................... 716/2 |

* cited by examiner

Primary Examiner—Matthew Smith
Assistant Examiner—Vuthe Siek
(74) Attorney, Agent, or Firm—Brown, Raysman, Millstein, Felder & Steiner, LLP

(57) ABSTRACT

A method and apparatus that displays a "delay chart" on a display screen, using a variety of user-selected formats and representing delays of a circuit being debugged. These formats include right-to-left and left-to-right displays. The displays can optionally have duplicative paths merged and zero delay paths removed. The invention also allows the designer to select various parts of the delay chart and then automatically highlights related portions of HDL code for the circuit (which also is displayed on the display screen). Conversely, the designer can select portions of the HDL code and the invention will automatically highlight related portions of the delay chart. Thus, the designer can easily determine which parts of the HDL caused large delays in the circuit being designed and can easily change those parts of the HDL in an attempt to obtain more desirable timing.

35 Claims, 35 Drawing Sheets

```
Module merge2(a, b,enab, z)
input [1:0] a;
input [1:0] b;
input enab;
output [1:0] z;         5910
assign z = enab ? a+b : a;
end module
                        5931
```

FIG. 14

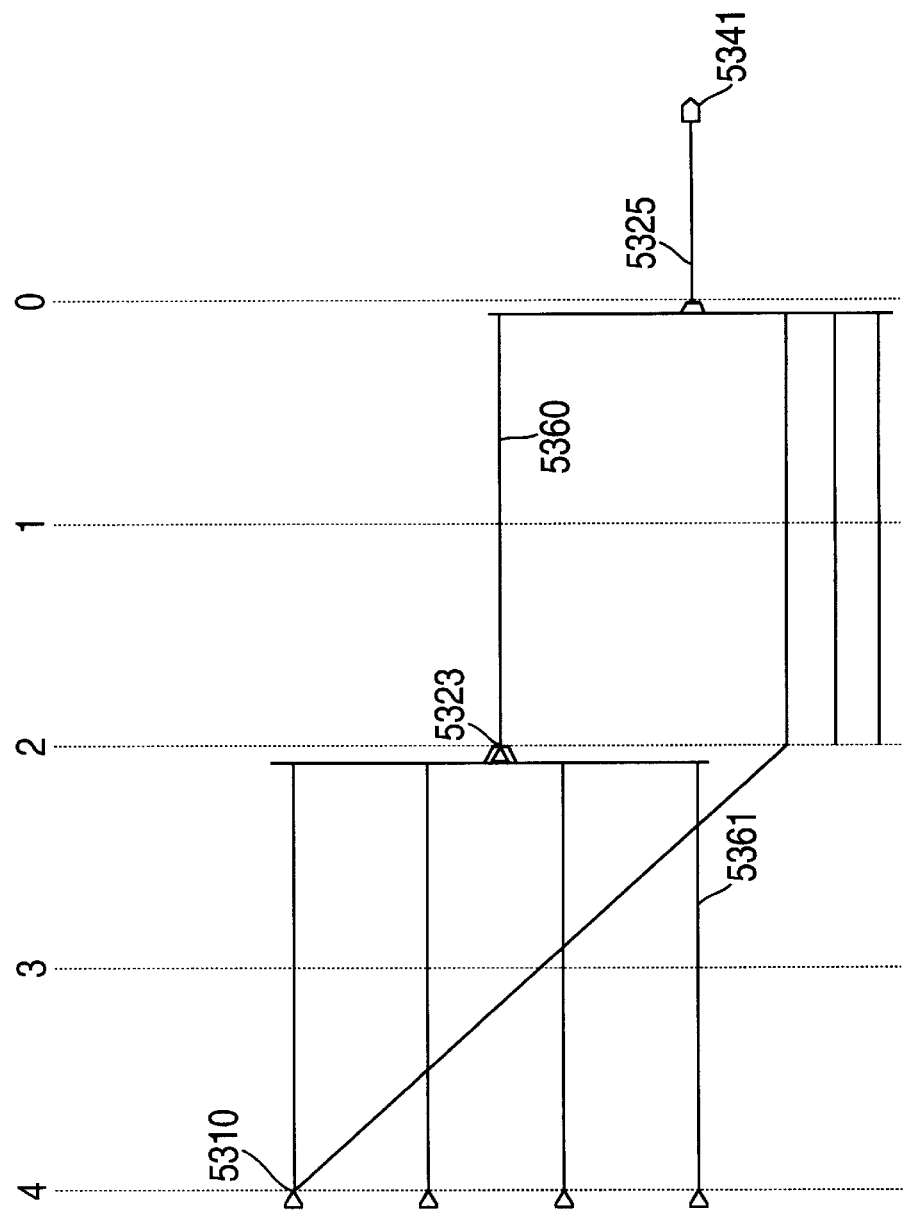

GTECH objects that
correspond to
selected objects

GRAPHIC REPRESENTATION OF CIRCUIT ANALYSIS FOR CIRCUIT DESIGN AND TIMING PERFORMANCE EVALUATION

RELATED APPLICATIONS

The following applications are related to the present application:
1) U.S. application Ser. No. 08/253,470, filed Jun. 3, 1994, entitled "Architecture and Methods for a Hardware Description Language Source Level Debugging System" of Gregory et al. now U.S. Pat. No. 6,132,109.
2) U.S. application Ser. No. 08/417,147, filed Apr. 3, 1995, entitled "Architecture and Methods for a Hardware Description Language Source Level Debugging System" of Gregory et al. now U.S. Pat. No. 5,937,190.
3) U.S. application Ser. No. 08/459,580, filed Jun. 2, 1995, entitled "Method and Apparatus for Context Sensitive Text Displays" of Gregory et al. now U.S. Pat. No. 5,870,608.

Each of these related applications is herein incorporated by reference.

FIELD OF THE INVENTION

This application relates to a method and apparatus for designing and debugging circuits and, particularly, to a method and apparatus for analyzing and debugging timing information of digital circuits.

BACKGROUND OF THE INVENTION

In recent years, human circuit designers have more trouble understanding and debugging the circuits they design. A first reason is that circuits are becoming larger and more complex. As circuit size increases, it becomes harder for a human being to keep all portions of the circuit in his mind at once. Even a moderate sized circuit of a few thousand gates contain tens or hundreds of millions of paths between the gates.

Another reason for increasing circuit complexity is that circuit designers often design the circuit at a functional level, using a Hardware Description Language ("HDL") such as VHDL or Verilog. The HDL code is then translated into an internal representation of a circuit in the memory of a computer. Once an internal circuit representation exists, the circuit designer tests the circuit representation to determine whether the circuit is acceptable. If the circuit is not acceptable, the designer will change the HDL description until an acceptable circuit is obtained.

An important criteria in determining whether a circuit is acceptable is whether the circuit meets its timing constraints. The time required for a signal to pass between circuit elements is called "delay." A circuit does not meet its timing constraints when some of the paths through the circuit have too long a delay.

As discussed above, even a moderate sized circuit having a few thousand gates can have tens or hundreds of millions of paths.

Therefore, it is not uncommon for a circuit to have many thousands of paths with delays that are too long. Of course, the existence of thousands of long paths does not necessarily mean that thousands of changes need to be made to the circuit. Often, one change to the circuit, such as moving an operation from one cycle to another, performing operations in parallel instead of serially, or using a faster implementation of a sub-function, will fix a timing problem.

Unfortunately, conventional timing analyzer CAD tools do not make it easy to identify the relationships between long paths. Therefore, it is often difficult to identify the parts of a circuit that need to be changed in order to eliminate long paths. Conventional software tools do not identify the parts of the circuit that participate in a large number of long paths. If the circuit was specified at the functional level, this problem is especially difficult, because it is not always easy to identify which parts of the functional description generate which paths of the circuit. Because conventional tools make it difficult to find which parts of the circuit participate in many long paths, designers often resort to fixing the long paths identified by the timing analysis CAD tool, only to find that the next run of the tool finds a new set of long paths that are only slightly shorter than the paths just fixed. Without the ability to find parts of the circuit that participate in many long paths, the designer is forced into many iterations of fixing paths and then rerunning the conventional CAD tool to find the next longest paths.

The following paragraphs provide a detailed description of a typical design process performed by a circuit designer and are provided as an aid to understanding the circuit design process. When designing a circuit, a human designer first conceives of a particular function to implement, as well as constraints such as timing or area that the implementation must meet. Next, the designer mentally transforms the desired function into a high level generic technology (Gtech) circuit including components such as gates, adders, and registers.

The designer then chooses a technology provided by a semiconductor vendor from which the circuit components will be chosen. The process of choosing circuit components from a specific technology is called mapping; mapping creates a "mapped circuit." To map a circuit, the designer draws a schematic of a mapped circuit that implements the desired function with a CAD schematic capture tool. The mapped circuit includes parts from a software representation of a specific technology library which is supplied by a silicon vendor. The schematic shows how more primitive functional elements, such as gates or transistors, connect together to form more sophisticated functions such as arithmetic logic units. In addition, modem schematic capture tools allow the designer to divide the design hierarchically into interconnected pieces, and then allow the user to specify the details of each of the pieces separately. For example, Design Architect by Mentor Graphics of Wilsonville, Oreg. provides these schematic capture functions.

Conventional CAD tools, such as those indicated above, can then take the connections in the schematic and other information to evaluate the mapped circuit and to specify the tooling necessary to construct the circuit. Such tools evaluate the mapped circuit in many ways. For example, commercial CAD tools often have a simulator that predicts the response of the mapped circuit to designer specified input patterns. QuickSim II by Mentor Graphics of Wilsonville, Oreg. is a commonly used simulator. Another common CAD tool is a path delay analyzer that identifies the longest timing path in a mapped circuit design. DesignTime by Synopsys, Inc. of Mountain View, Calif. is a tool that provides path delay analysis.

Alternately, designers can design circuits using a synthesis method. In synthesis, the designer describes the desired function using VHDL, Verilog, or any other synthesis source language, to specify the behavior. This allows the designer to specify the digital circuit at a higher level and allows the CAD tools to assist the designer in defining the functionality of the digital circuit. A software translator then converts that description into generic technology structures that directly correspond statement by statement with the designer's description. Mapping replaces the generic technology structures with structures from a specific technology library. Technology libraries are provided by silicon vendors to specify the types of parts which the vendor can manufacture. Technology libraries include specific information regarding the functionality and physical characteristics such as area and delay of gates which can be built by the silicon vendor. Technology libraries are designed to work with synthesis systems. A synthesis system can use a technology library to choose available gates from which the silicon vendor can fabricate the digital circuit. Because synthesis enables the designer to look at higher levels of abstraction, circuits tend to be even larger than circuits developed without synthesis tools.

As discussed above, conventional CAD tools allow a designer to examine only a single discrete path in the circuit at a time. This is problematic and leads to an iterative design process in which the designer repeatedly changes a circuit to shorten the longest path. Furthermore, because synthesized circuits can be very large, it becomes problematic to fix problems involving timing delays in synthesized circuits.

SUMMARY OF THE INVENTION

A preferred embodiment of the present invention overcomes the problems and disadvantages of the prior art by displaying a "delay chart" of a circuit on a display screen using a variety of user-selected formats. These formats include right-to-left, left-to-right, merged (in which duplicative paths are merged together), and elimination of zero length paths. A delay chart graphically represents the paths in a circuit so that the length of a path on the display corresponds directly to the path delay. Thus, paths with long delays will be displayed as longer than paths with short delays.

The described embodiment also allows the designer to select various parts of the delay chart and then automatically highlights related portions of the HDL code (which also is displayed on the display screen). Conversely, the designer can select portions of the HDL and the described embodiment will automatically highlight related portions of the delay chart. Thus, the designer can easily determine which parts of the HDL caused large delays in the circuit being designed and can easily change those parts of the HDL in an attempt to obtain more desirable timing.

The present invention also allows the designer to examine the delay chart in a variety of ways. For example, the designer can choose to highlight the fanins and fanouts of a selected pin or can choose to highlight the longest and shortest paths in the circuit. The designer can also highlight paths that are longer or shorter than a specified percentage of the longest path. Any highlighted path can be "selected" to have additional operations performed on it. For example, the designer can "prune" selected paths from the displayed delay chart to make the delay chart to display only paths of interest. In general, the designer can prune either all selected paths or all non-selected paths.

In accordance with the purpose of the invention, as embodied and broadly described herein, the invention is a method for assisting a designer in debugging a circuit, comprising the steps, performed by a data processing system, of: providing a circuit representation stored in a memory of the data processing system, the circuit representation representing a circuit having at least one path with an associated delay; generating a Direct Acyclic Graph (DAG) in the memory in accordance with the circuit representation; and displaying a delay chart on a display device in accordance with the DAG, where the delay chart represents the delay of the circuit graphically.

Advantages of the invention will be set forth in part in the description which follows and in part will be obvious from the description or may be learned by practice of the invention. The objects and advantages of the invention will be realized and attained by means of the elements and combinations particularly pointed out in the appended claims and equivalents.

BRIEF DESCRIPTION OF THE DRAWINGS

The accompanying drawings, which are incorporated in and constitute a part of this specification, illustrate several embodiments of the invention and, together with the description, serve to explain the principles of the invention.

FIG. 14 is an example of HDL source code.

FIGS. 27(a) and 27(b) show an example of a delay chart before and after pruning.

DESCRIPTION OF THE PREFERRED EMBODIMENTS

Reference will now be made in detail to the preferred embodiments of the invention, examples of which are illustrated in the accompanying drawings. Wherever possible, the same reference numbers will be used throughout the drawings to refer to the same or like parts.

I. Background

Figure 1:
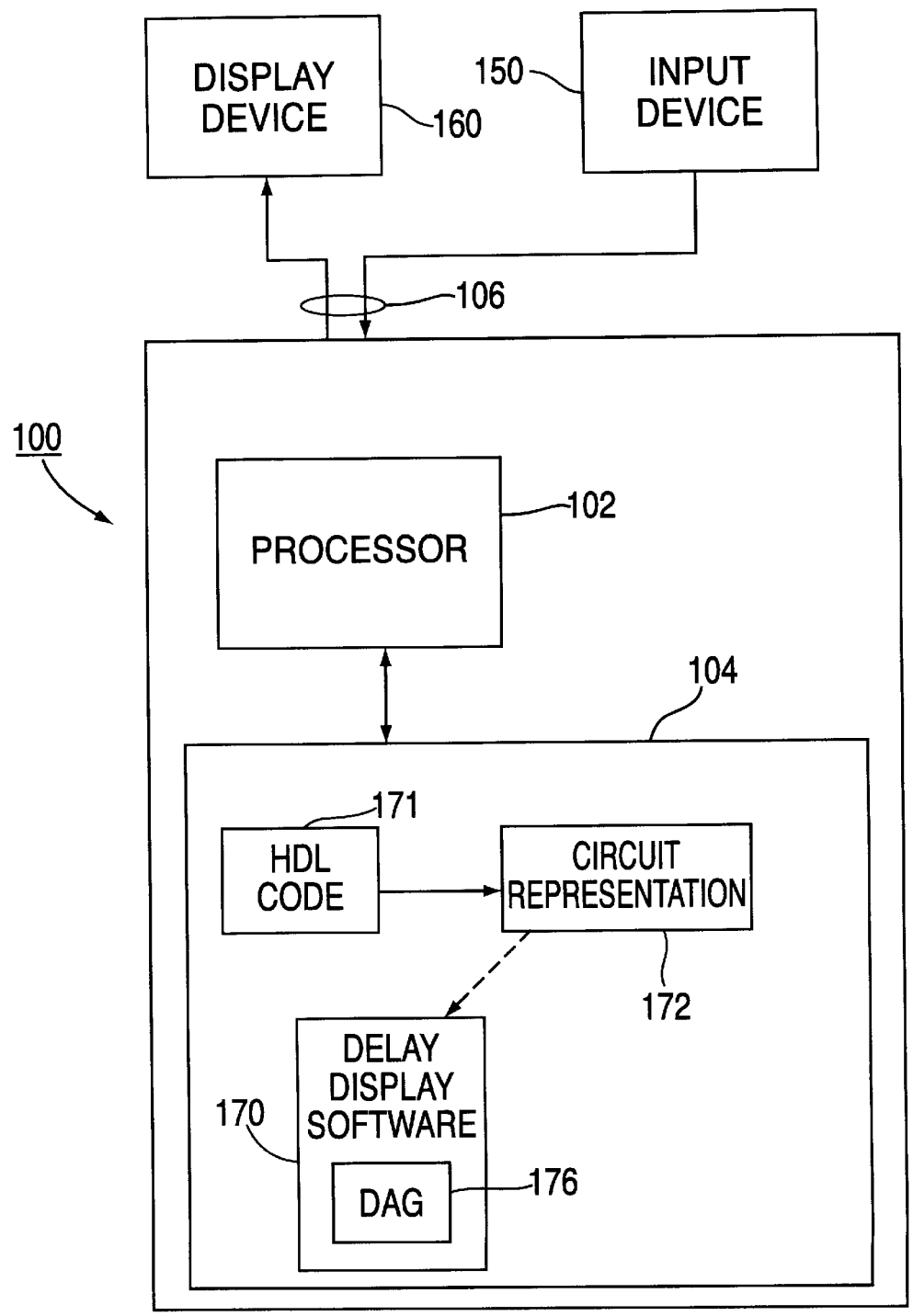
FIG. 1 is a block diagram of a computer system in accordance with a first embodiment of the present invention.

FIG. 1 is a block diagram of a computer system in accordance with a first embodiment of the present invention. Computer system 100 includes a processor 102; a memory 104; input/output lines 106; an input device 150, such as a keyboard or mouse; and a display device 160, such as a display terminal. Computer system 100 further includes an input device (not shown) for reading a computer usable medium having computer readable program code means embodied therein. This input device is, for example, a disk drive or a CD ROM reader. Memory 104 of computer 100 includes delay display software 170 (hereinafter "display software") in accordance with the described embodiment of the present invention. Display software 170 includes a DAG ("Directed Acyclic Graph") 176. Memory 104 also includes a circuit representation (sometimes shortened to "circuit") 172, as described below. FIG. 1 also shows several optional elements, such as HDL code 171, that may not be present in all implementations of the present invention. In certain embodiments, circuit representation 172 is generated from HDL code 171. In other embodiments, circuit representation 172 is generated by some other method or is read into the system from an outside source.

A person of ordinary skill in the art will understand that memory 104 also contains additional information, such as application programs, operating systems, data, etc., which are not shown in the figure for the sake of clarity. Computer system 100 can also include numerous elements not shown in the Figure for the sake of clarity, such as additional disk drives, keyboards, display devices, network connections, additional memory, additional CPUs, LANs, input/output lines, etc. A preferred embodiment of the present invention runs under the Unix operating system, but any appropriate operating system can be used.

As indicated in FIG. 1, display software 170 reads circuit representation 172 and outputs a corresponding delay chart to display device 160. In some implementations of the present invention, display software 170 is also capable of causing corresponding sections of HDL code 171 to be highlighted. The described embodiment of display software 170 uses a "windows" type user interface, although any appropriate user interface can be used to implement the present invention.

II. Example of a Delay Chart Display

Figure 2:
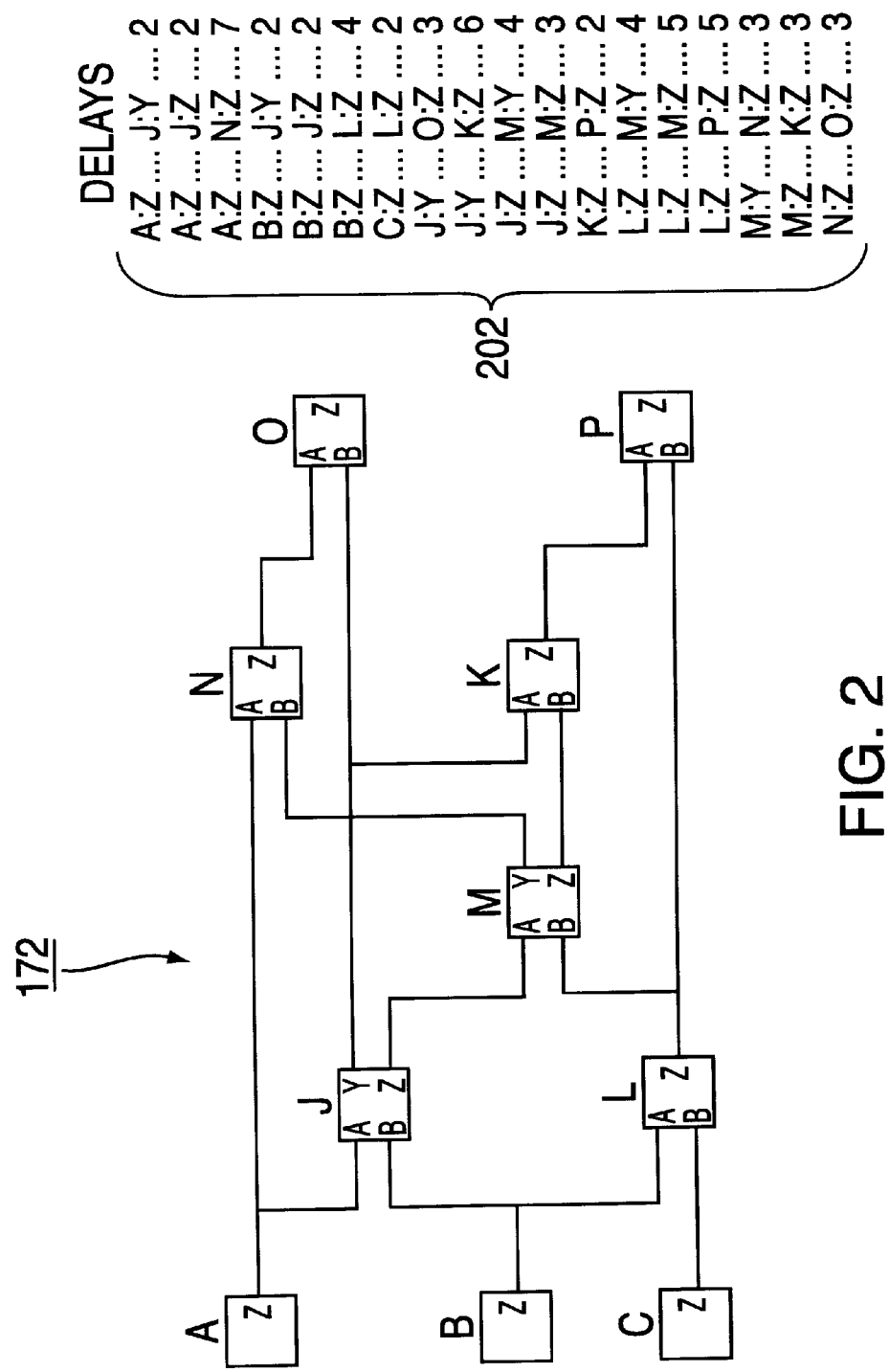
FIG. 2 shows a circuit representation stored in the memory of FIG. 1 before a delay chart is built for the circuit representation.

Before discussing how a delay chart is generated, the following paragraphs discuss an example of the appearance of a delay chart for a particular circuit representation. FIG. 2 is a representation 172 of a circuit stored in memory 104 of FIG. 1. The figure shows circuit representation 172 of having inputs A, B, and C; and outputs O and P. The circuit represented in FIG. 2 is, of course, simpler than most circuits with which the present invention is used. A simple circuit is used to enhance the clarity of the example. FIG. 2 shows that circuit representation 172 includes the delay values 202 between outputs of each connected cell in the circuit. The delay values can be stored, for example, as attributes of the circuit elements, in a table, or in any other appropriate way.

It should be noted that the present invention can be used with any circuit representation that includes delay values between connected cells, as shown in FIG. 2. Preferably, the delay values are stored so that each delay value is associated with a path between cell outputs. In the figure, for example, the path from output Z of cell A to output Y of cell J has a delay of "2" time units and the path from output Z of cell A to output Z of cell N has a delay of "7" time units.

Figure 3:
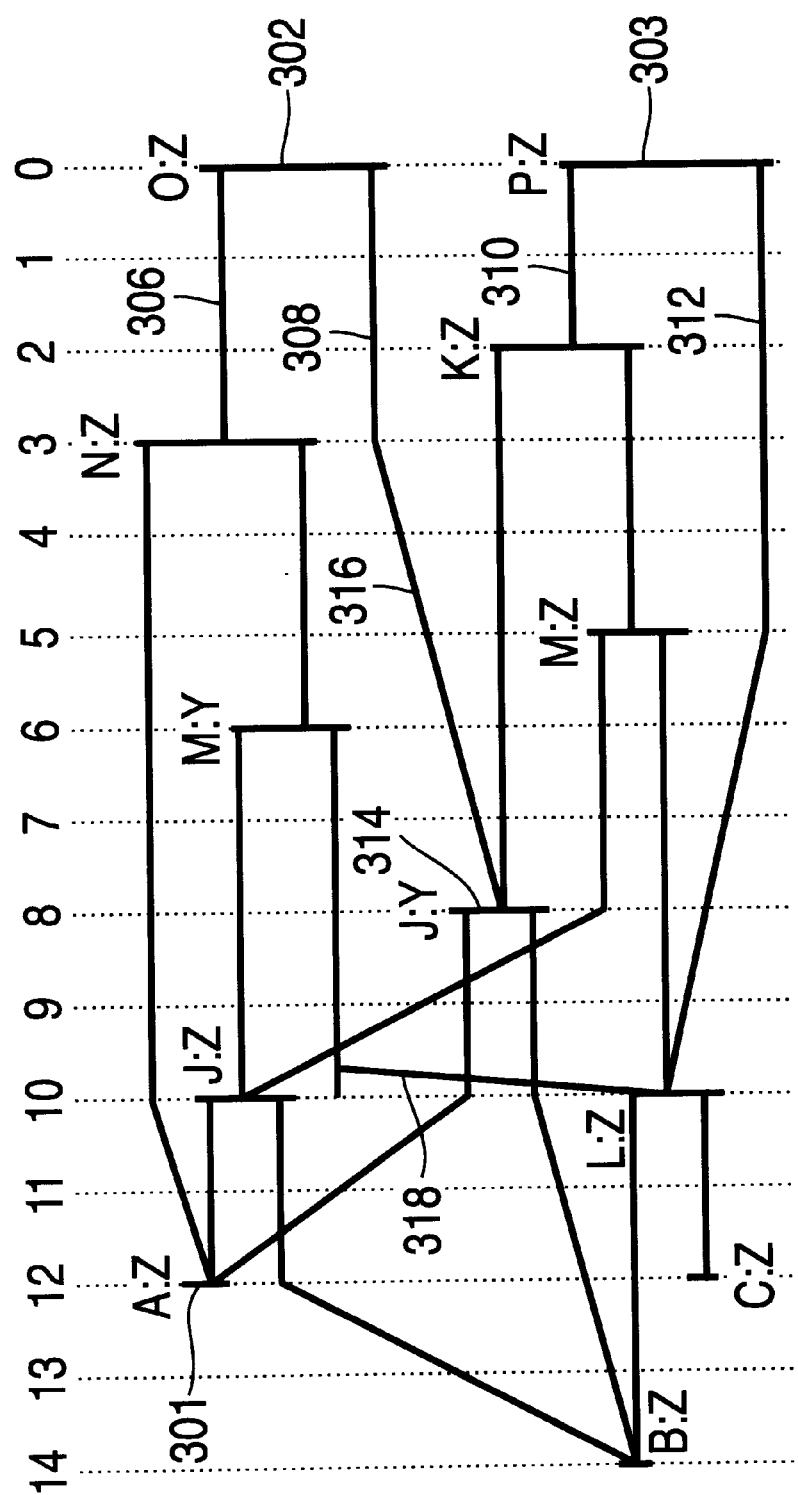
FIG. 3 shows an example of a right-to-left delay chart generated in accordance with a preferred embodiment of the invention for the circuit representation of FIG. 2.
Figure 4:
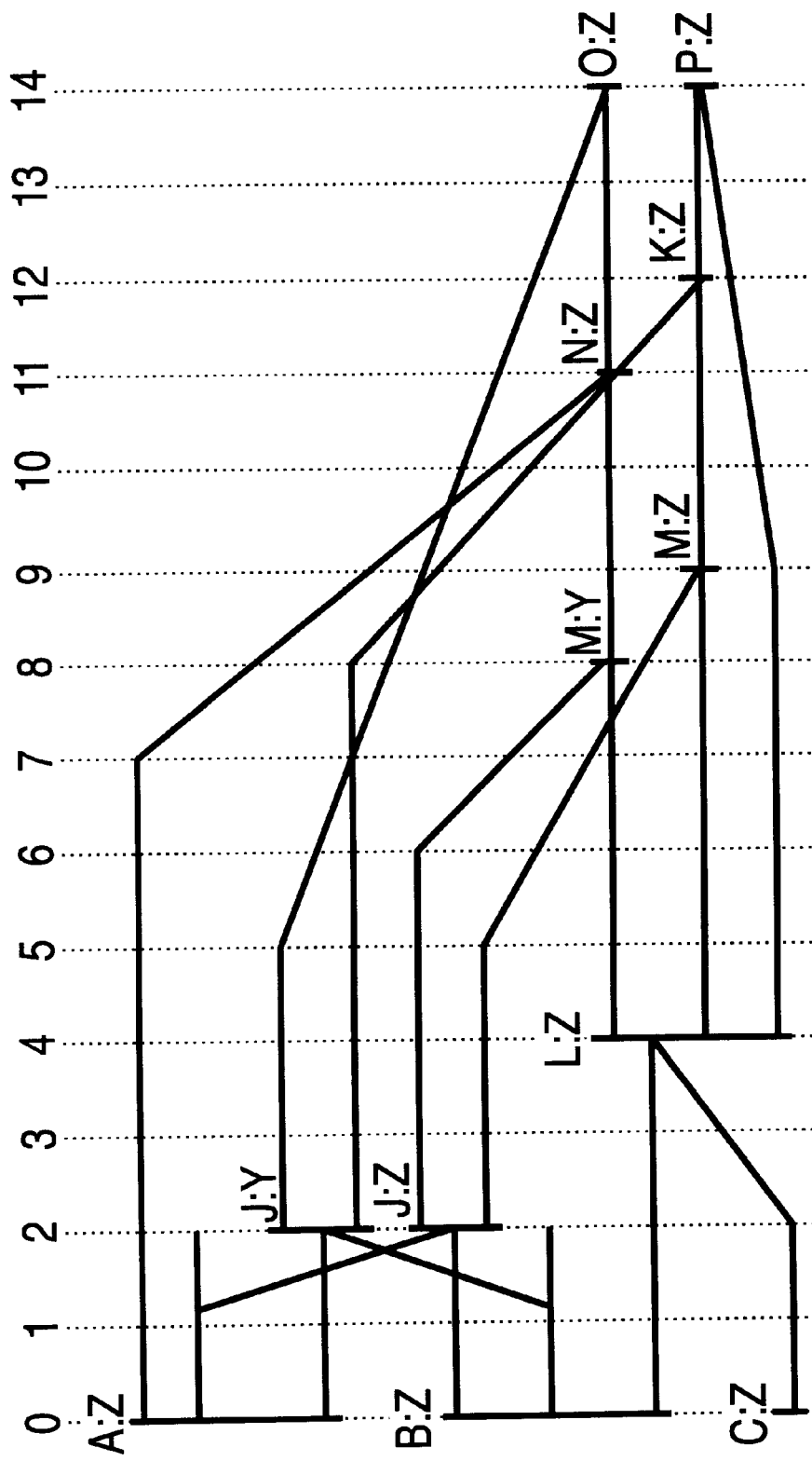
FIG. 4 shows a left-to-right delay chart generated in accordance with a preferred embodiment of the invention for the circuit representation of FIG. 2.

FIG. 3 shows an example of a right-to-left delay chart generated in accordance with a preferred embodiment of the invention for the circuit representation of FIG. 2. FIG. 4 shows a left-to-right delay chart generated in accordance with a preferred embodiment of the invention for the circuit representation of FIG. 2. Delay charts allow a human designer to graphically see which delays in a circuit combine to create critical paths of a circuit representation and help a designer find "bottlenecks" in the circuit. In addition, delay charts show which delays are not important in determining the speed of the circuit.

In FIGS. 3 and 4, a vertical line, such as line 301, represents an output pin of a cell and a horizontal line represents the delay from the output pin of one cell to the output pin of another cell. The length of each horizontal line is proportional to the amount of delay between the two pins. Note that the display preferably has a horizontal scale representing units of time. In a preferred embodiment, the vertical bars on the delay chart can be "undisplayed" by the designer.

The example of FIG. 3 shows a delay chart generated from the right to the left. As shown in FIG. 3, the method places vertical lines 302 and 303 for the output pins of cells O and P and horizontal lines 306, 308, 310, 312 for the delay values that end at those pins. The way of determining horizontal placement of cells O and P on the delay chart are discussed below in a separate section.

Because the top delay 306 to O:Z is the only one that starts from N:Z, the vertical line for N:Z is placed at the left end of this delay. Therefore, N:Z is displayed in the diagram along with the delays that end on it. Similarly, K:Z and the delays that end on it are also displayed.

Note that pin J:Y 314 is the start of more than one delay: the bottom delay into O:Z and the start of the top delay into K:Z. In the described embodiment, the vertical line is placed at the point that is farthest from the zero point. Therefore, J:Y is placed at the left end of the delay into K:Z. A diagonal line 316 is drawn from J:Y to the left end of the delay into O:Z to indicate that this delay also starts at J:Y.

Note that the left ends of the bottom delays into M:Y and M:Z are both at time "10." In the described embodiment, when there is a tie, the delay position is chosen arbitrarily. In this case, L:Z is placed at the left end of the delay into M:Z and a diagonal line 318 is drawn to the other delays. If line 318 were drawn from L:Z to the left end of the delay into M:Y, the diagonal would be vertical. Therefore, in the described embodiment, line 318 is drawn to a point a bit from the end of the delay. In FIG. 3, the output pins of cell J fall at different time values. This shows why, in the described embodiment, delay charts are generated at the pin level instead of at the cell level.

The above small example demonstrates the following advantages of delay charts. First, they show which delays in a circuit combine to create the critical path (or paths) of a circuit representation. In the example, there are two critical paths: B:Z-L:Z-M:Y-N:Z-O:Z and B:Z-L:Z-M:Z-K:Z-P:Z. Second, delay charts show paths that are closest to critical. For example, this diagram shows that the longest path from C:Z to P:Z is only two time units shorter than the longest paths. Third, delay charts can help a designer find "bottlenecks": sections of the circuit that are part of many long paths. In the above example, the delay chart shows that reducing the B:Z-L:Z delay by two would reduce both of the longest paths, but any further reduction of that delay would not reduce the longest paths unless delays A:Z-J:Z, B:Z-J:Z, and C:ZL:Z were also reduced. Fourth, delay charts show which delays are not important in determining the speed of the circuit. For example, the J:Y-O:Z delay's diagonal shows a "gap" of five time units. That is, the delay could be five time units greater without changing the time value of J:Y.

As discussed, FIG. 3 shows a right-to-left delay chart. In contrast, FIG. 4 shows a delay chart for the circuit representation of FIG. 2 generated in a left-to-right direction and displayed on display device 150 (preferably in its own window). A right-to-left delay chart shows how the delays in the circuit combine to cause the earliest required time value for each output pin of each cell. For example, if cells O and P are registers, the X location of L:Z indicates that its logic value must be computed at least 10 time units before the end of the cycle. (Another name for earliest required time is "maximum time units to end point"). In contrast, a delay chart laid out in the left-to-right direction shows how the delays in the circuit combine to cause the latest arrival time value for each output pin of each cell. That is, the X location of a pin indicates the maximum number of time units back to a start point.

The described embodiment generates either a left-to-right or a right-to-left delay chart in accordance with input from the designer. For example, the designer could select either a left-to-right or a right-to-left from a dialog box displayed by display software 170. A designer might request a delay chart from either direction, depending on the type of circuit analysis he is performing. For example, the two long paths are easier to see in the diagram of FIG. 4 than in the diagram of FIG. 3.

Figure 5A:
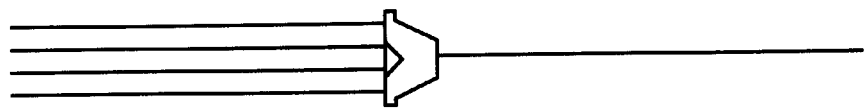
FIG. 5(a) through FIG. 5(h) show symbols used in the display in the described embodiment.

FIG. 5(a) through FIG. 5(h) show symbols used in the display in the described embodiment of the present invention. When using a delay chart, a designer often finds it useful to know the cell type of the pins on the diagram. It should be understood that the symbols in FIGS. 5(a) through 5(h) are examples only and that other implementations of the present invention may use some, all or none of the specific symbols shown here. In general, various implementations of the invention will use different symbols, depending on the technology librar(ies) being used. Thus, instead of the vertical lines used in FIGS. 3 and 4, another preferred embodiment of the present invention represents each cell in the delay chart by a symbol representing its type. FIG. 5(a) shows an example of an adder. The symbol preferably is drawn with its right edge at the point where the vertical line would go if there was no symbol. That is, the x position of the right edge of the symbol indicates the time values for the pin. The symbol "steals" space on the display from the delay segments ending at the pin. Therefore, the logical length of a delay segment includes the width of the symbol at its right end.

The symbol of FIG. 5(a) can also represent one or more outputs pins of a subtractor, a multiplier, or a comparator. Adders, subtractors, and multipliers usually correspond to HDL source expressions that use the +, −, or * operator. Comparators usually correspond to conditional expressions that use the <, <=, >, or >= operators.

The size of a symbol depends on the amount of room that is available for it in the delay chart. In other words, in the described embodiment, the size of the symbol is not significant. Each symbol used in the described embodiment is discussed below.

Figure 5B:
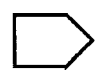

The symbol of FIG. 5(b) represents an input port on the left side of a chart. On the right side of a chart, the symbol represents an output port of a circuit. This symbol can appear within a unit-delay diagram to represent a port of a subdesign (see below).

Figure 5C:

The symbol of FIG. 5(c) represents one or more register outputs on the left side of a chart. On the right side of a chart, the symbol represents one or more register input pins. The "notch" on the symbol is present only to make the symbol reminiscent of the traditional schematic symbol for a register. A segment that connects to the symbol at the notch preferably does not represent a connection to a clock pin of the register, since the described embodiment of the invention does not show clock logic.

Figure 5D:

The symbol of FIG. 5(d) represents output pins of Sel, RegLdSel, and Mux cells. These cells usually correspond to conditional statements (if, case) in HDL code. Sel and RegLdSel sells are similar to Mux cells, except that their control inputs are not encoded. RegLdSel cells are selectors that drive the sync_load inputs of registers. That is, instead of determining what will be loaded into a register, they determine when the register will be loaded.

Figure 5E:

The symbol of FIG. 5(e) represents output pins of control logic cells. Control logic calculates the control inputs to selectors. Thus, when a selector symbol occurs in a diagram, the delay segments leading into that symbol that have this control logic at the other end correspond to the control inputs of the selector. The other delay segments leading into the selector symbol correspond to the data input of the selector. Sometimes, all delay segments into a selector symbol may come from control symbols. This means that all the data inputs to the selectors are constants. This could happen, for example, if a signal is set to one constant clause in the "then" part of an "if" HDL statement and to another constant clause in the "else" part of the HDL statement. Often, when the designer selects a control logic symbol in a delay chart, HDL browser will highlight a corresponding process in VHDL or an "always" block in Verilog. This means that the control logic drives selectors that correspond to different source constructs. Because the control logic can't be uniquely associated with one of these source constructs, it is associated with the containing process or "always" block.

Figure 5F:

The symbol of FIG. 5(f) also represents output pins of a Boolean (Bool) cell. Bool cells usually correspond to expressions that use Boolean operators, such as ~, !, |, &, ==, and != in Verilog and =, AND, OR, and NOT in VHDL. One Bool cell may correspond to an expression that contains multiple operators. For example, one Bool cell may correspond to the expression ((A OR B) AND C). That is, there is not necessarily one Bool cell per operator. The number of time units of delay for a Bool cell depends on the complexity of the expression it implements.

Figure 5G:
Figure 5H:

The symbol of FIG. 5(g) represents pins of tristate cells. The symbol of FIG. 5(h) preferably represents pins of any other type of cell not discussed above. Because some of the symbols represent more than one cell type, the described embodiment implements an "info tip" to determine the specific cell type. For example, if the designer places the cursor on a cell of FIG. 5(a) for a predetermined amount of time (e.g., 2 seconds), a message is displayed near the cell identifying the type of cell. It will be understood that the processor obtains the message indicating the cell type from either the DAG or the circuit representation, which maintains such messages (or a pointer to the message).

Figure 6:
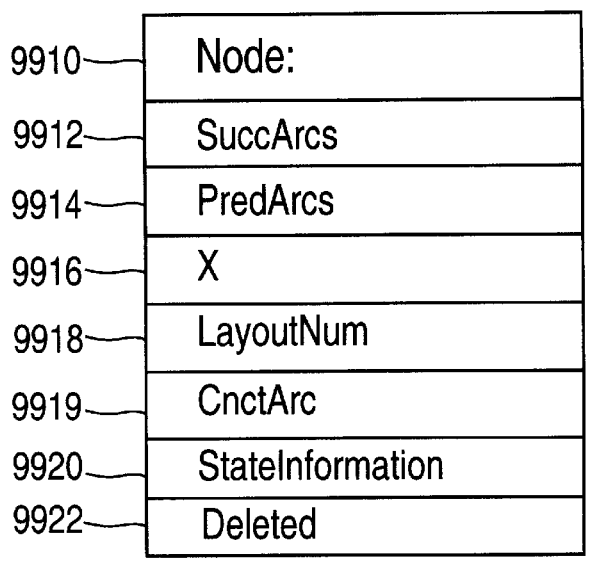
FIG. 6 is block diagram which shows the data structures used by the DAG.
Figure 6:
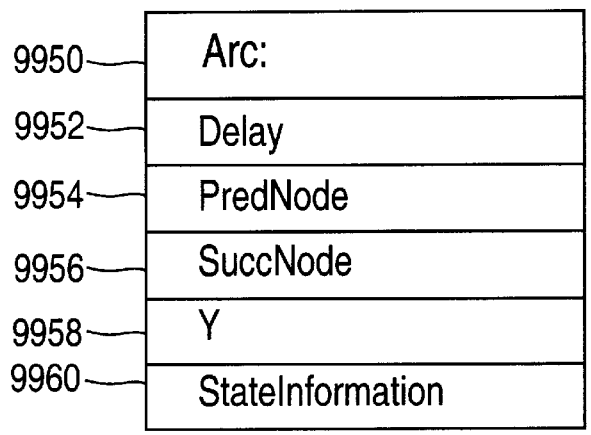
Figure 6:
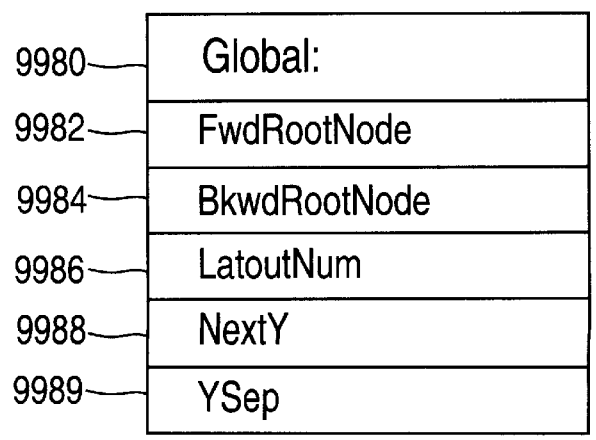
Figure 7:
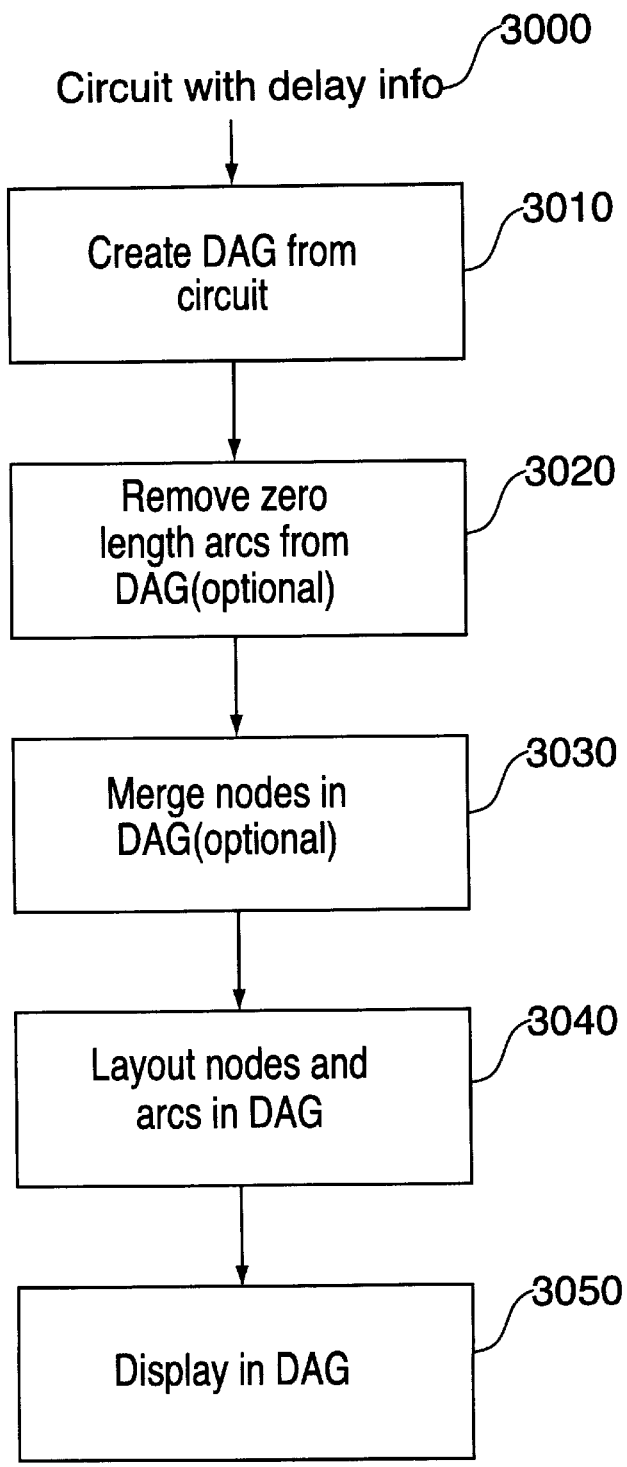
FIG. 7 is a flow chart which shows steps for creating a Circuit Delay Chart.

III. Generation of a Delay Chart a. Overview of Generation of a Delay Chart FIG. 7 is a flow chart representing a method used to generate a delay chart in accordance with delays in circuit representation 172, while FIG. 6 shows an internal representation (elements of a DAG) used by the method of FIG. 7. It will be understood that the steps of all methods discussed below are performed by processor 102 of FIG. 1, executing computer instructions such as instructions of display software 170 stored in memory 104. It will be apparent to one skilled in the art that other implementations could be used to create such circuit timing displays in accordance with the present invention.

Data Structures

FIG. 6 shows some example data structures that can be used to maintain the DAG. It will be apparent to one skilled in the art that these data structures can be implemented in a variety of ways and that the following paragraphs are included by way of example only. In one embodiment of the present invention, the DAG contains node and arc data structures, as well as a global structure for storing data used with a variety of nodes or arcs.

In FIG. 6, structure 9910 is a node which stores information for a node in the DAG and contains at least the following information:

SuccArcs 9912 is a list of successor arcs for this node.
PredArcs 9914 is a list of predecessor arcs for this node.
X 9916 is a number which contains the X layout value for this node.
LayoutNum 9918 is a number which indicates the last layout during which this node's X value was calculated.
CnctArc 9919 is a pointer to the arc to which the current node will be connected to in the layout.
State 9920 is a structure which contains various state information about this node. For example, in one embodiment the state information will include the type and source id of the circuit element from which this node was derived.
Deleted 9922 is a boolean flag which indicates if this node is to be deleted from the graph. This flag is used, for example, when removing zero length arcs.

Arc structure 9950 stores information for an arc in the DAG and contains at least the following information.

Delay 9952 is a number which stores the delay incurred by this arc.
PredNode 9954 is a pointer to the predecessor node for this arc.
SuccNode 9956 is a pointer to the successor node for this arc. Y 9958 is a number which is the Y layout value for this arc.
State 9960 is a structure which contains various state information about this arc. For example in one embodiment the state information will include the type and source id of the circuit element from which this arc was derived.

Structure 9980 stores global values for the DAG and contains at least the following information.

FwdRootNode 9982 is a pointer to a node which is used as a root node for the graph. All nodes in the graph are successors, either directly or recursively, of this node.
BkwdRootNode 9984 is a pointer to a node which is used as a root node for the graph. All nodes in the graph are predecessors, either directly or recursively, of this node.
LayoutNum 9986 is a number which is the number of layouts which have been done on the DAG.
NextY 9988 is a number which is the next available Y value for this DAG.
YSep 9989 is a number which is the amount by which arcs should be separated.

Circuit Delay Chart Creation

FIG. 7 is a flow chart which shows steps for creating a Circuit Delay Chart. The input to the method is a circuit with delay information 3000, such as circuit 172 of FIG. 1.

Figure 8A:
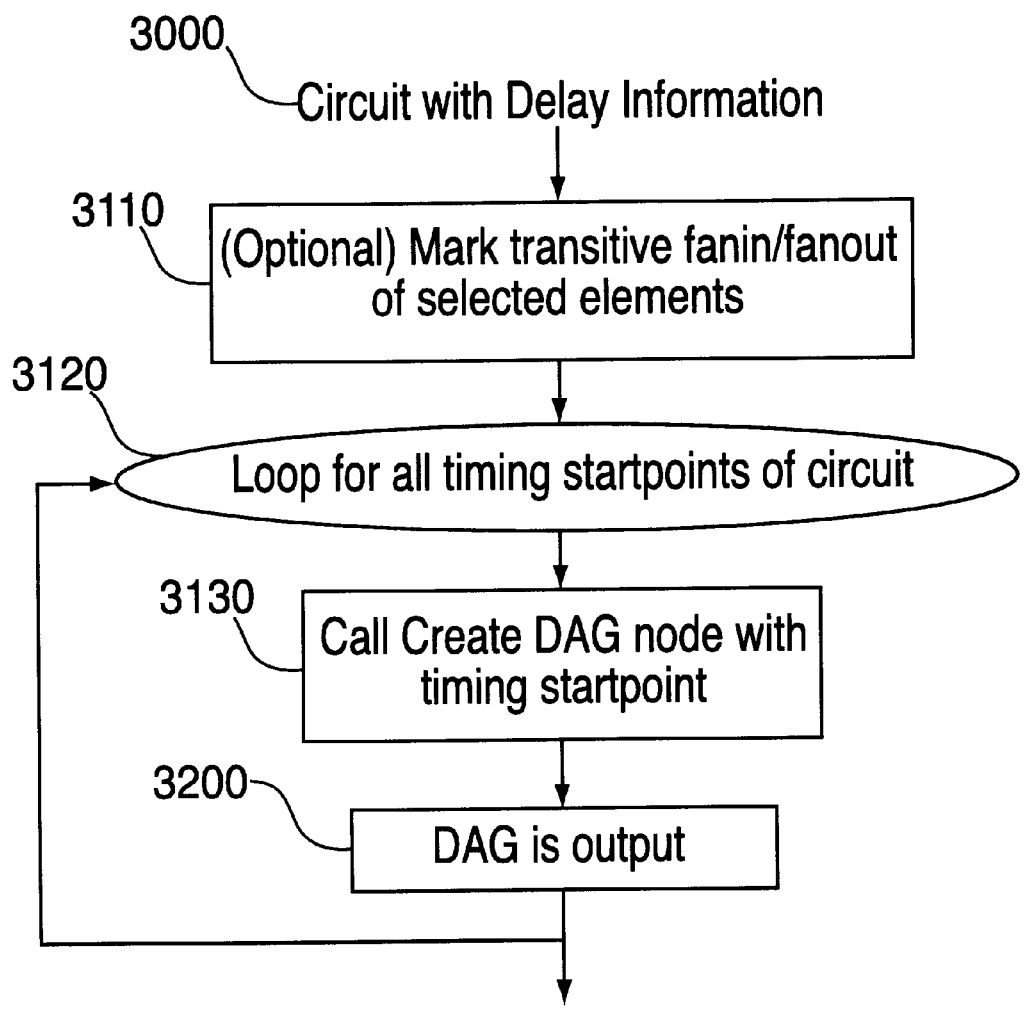
FIG. 8(a) is a flow chart which shows steps for creating the DAG from a circuit.
Figure 8B:
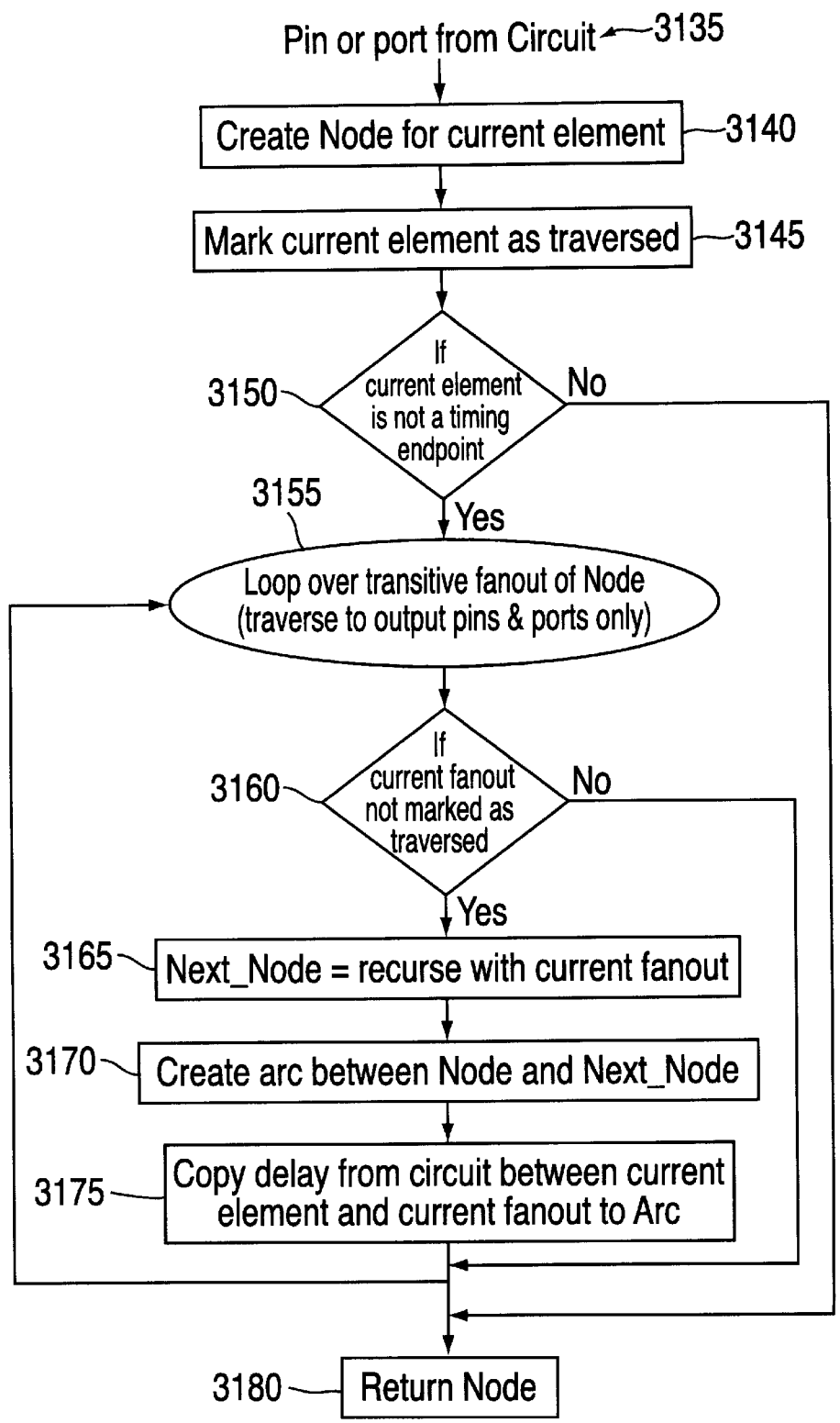
FIG. 8(b) is a flow chart which shows steps for creating a DAG Node and all of its child nodes and arcs.

Step 3010 creates a DAG from the circuit representation. Substeps for a method for creating the DAG are shown in FIGS. 8(a) and 8(b). Step 3020 is an optional step which removes zero length arcs from the DAG. This step is not necessary if the DAG does not contain any zero length arcs or if the designer indicates not to remove zero length arcs. Steps for a method for removing zero length arcs are shown in FIG. 13. Step 3030 is an optional step which merges nodes in the DAG together if, for example, the designer indicates that merging should occur. Steps for a method for merging nodes are shown in FIG. 12. Step 3040 lays out the nodes and arcs in the DAG, i.e., determines the placement of the nodes and arcs in the delay chart. Steps for laying out the DAG are shown in FIGS. 10(a)–10(d). Step 3050 displays the chart on display device 150. Steps for the Display DAG process are shown in FIG. 11.

b. Creation of a DAG

FIG. 8(a) is a flow chart which shows steps for creating the DAG from a circuit. The input to the method is a circuit with delay information 3000, such as circuit representation 172. In one embodiment, the delay information may be stored on the circuit elements. In another embodiment, the delay information may be stored in a table. In a third embodiment, the delay information may be available through a procedural interface. It will be apparent to one skilled in the art that the delay information may be made available in many ways.

Step 3110 optionally selects a portion of the circuit to be used for creating the DAG. By default, the entire circuit is used. In one embodiment, for example, the circuit portion is selected by the designer by marking the transitive fanin and fanout of a group of selected circuit elements. This enables the display to show only those elements which affect the group of selected circuit elements.

Loop 3120 loops over all of the timing startpoints of circuit. In one embodiment, timing startpoints are primary inputs and Q pins of registers. In another embodiment, timing startpoints are primary inputs and clock pins of registers. (If step 3110 has optionally selected only a portion of the circuit, then unmarked startpoints are skipped by loop 3120.) Step 3130 then calls Create DAG Node of FIG. 8(b) with the timing startpoint. The output of this routine is the DAG (step 3200).

FIG. 8(b) is a flow chart which shows steps for creating a DAG Node and all of its child nodes and arcs. The input to Create DAG Node is a pin or port 3135 from the circuit, this pin or port 3135 is called the current element. Step 3140 creates a DAG node, as shown in FIG. 6, for the current element. Step 3145 then marks the pin or port as having been traversed by this routine. Step 3150 checks to see if the current element is not a timing endpoint. In this case, loop 3155 loops over the transitive fanout of the current element to any output pins or ports driven by the current element. In each iteration of the loop, the fanout being processed is called the current fanout. Step 3160 checks to see if the current fanout has not been marked as already traversed. If it has already been marked, then the current fanout is part of a feedback loop and the cycle is implicitly broken at this point. Otherwise, step 3165 recurses into Create DAG Node to create next_node for the current fanout. Step 3170 creates an arc between node and next_node and step 3175 copies the delay from the circuit between the current element and the current fanout to the arc. Finally, step 3180 returns the node to the calling routine.

DAG Preprocessing Method

The DAG preprocessing method adds source and sink root nodes to the DAG and sets up the arcs connected to the root nodes.

Figure 9:
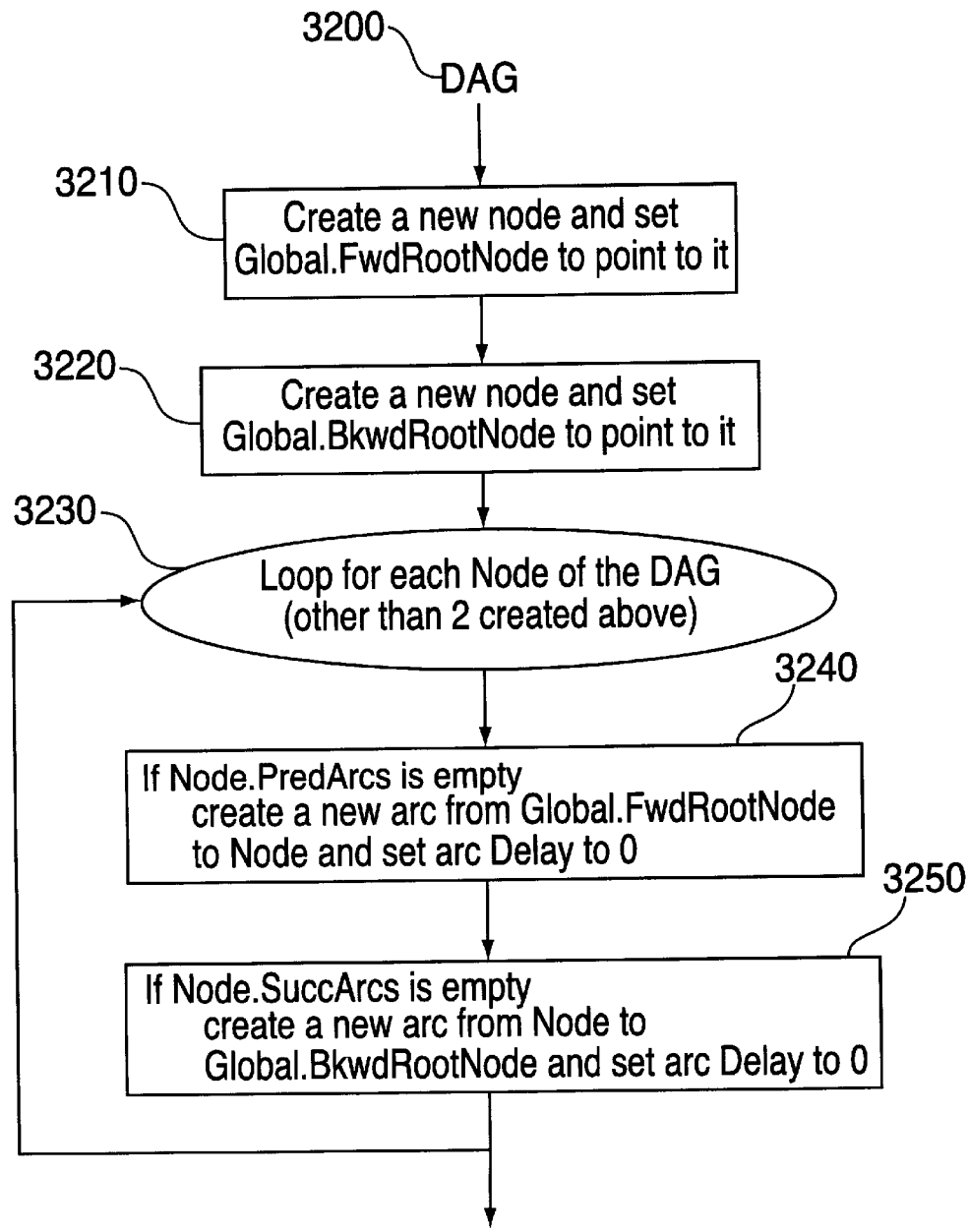
FIG. 9 is a flow chart showing steps for preprocessing the DAG.

FIG. 9 is a flow chart showing steps for preprocessing the DAG. The input to FIG. 9 is the DAG 3200. Step 3210 creates a new node and sets Global.FwdRootNode to point to it. Step 3220 creates a new node and sets Global.BkwdRootNode to point to it. These two nodes are the source and sink root nodes of the DAG, respectively. Loop 3230 loops for each node of the DAG other than the two nodes created above.

Step 3240 checks to see if the current node has any predecessor arcs. If not, it creates a new arc from Global.FwdRootNode to the current node and sets the arc delay to zero. Step 3250 checks to see if the current node has any successor arcs. If not, it creates a new arc from the current node to Global.BkwdRootNode and sets the arc delay to zero. At the end of this routine, the forward and backward root nodes have been added to the DAG.

c. Determining Placement in the Delay Chart

Figure 10A:
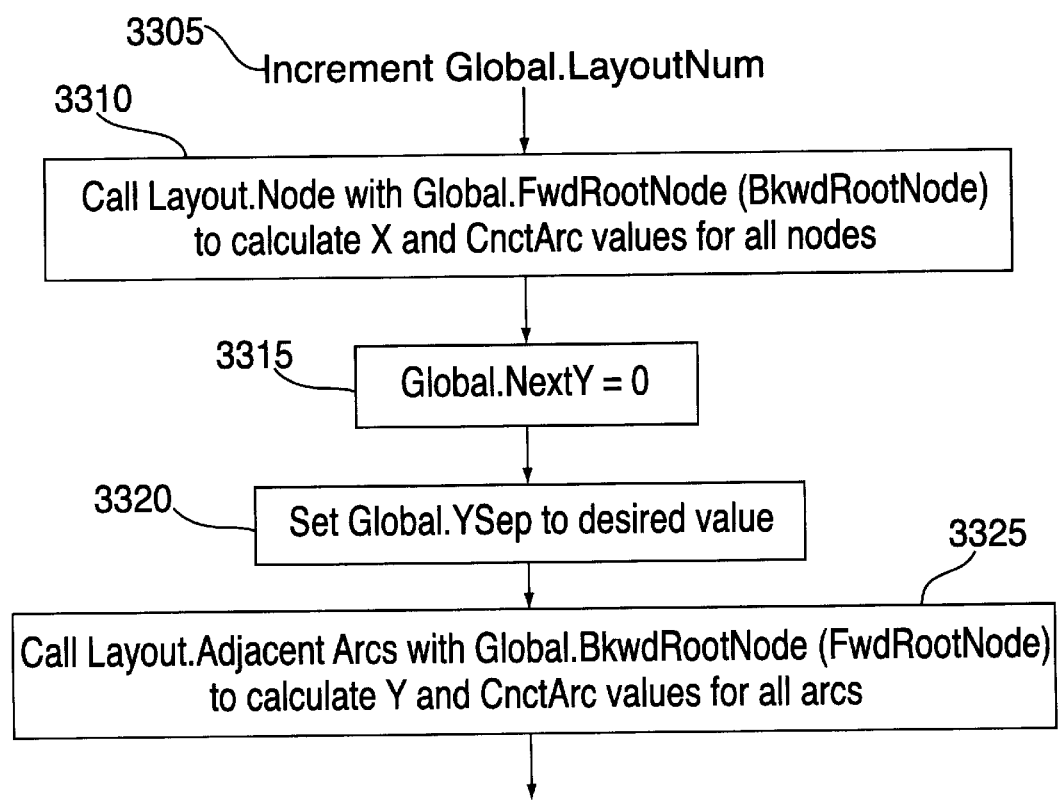
FIG. 10(a) is a flow chart which shows steps for computing the layout of a DAG.
Figure 11:
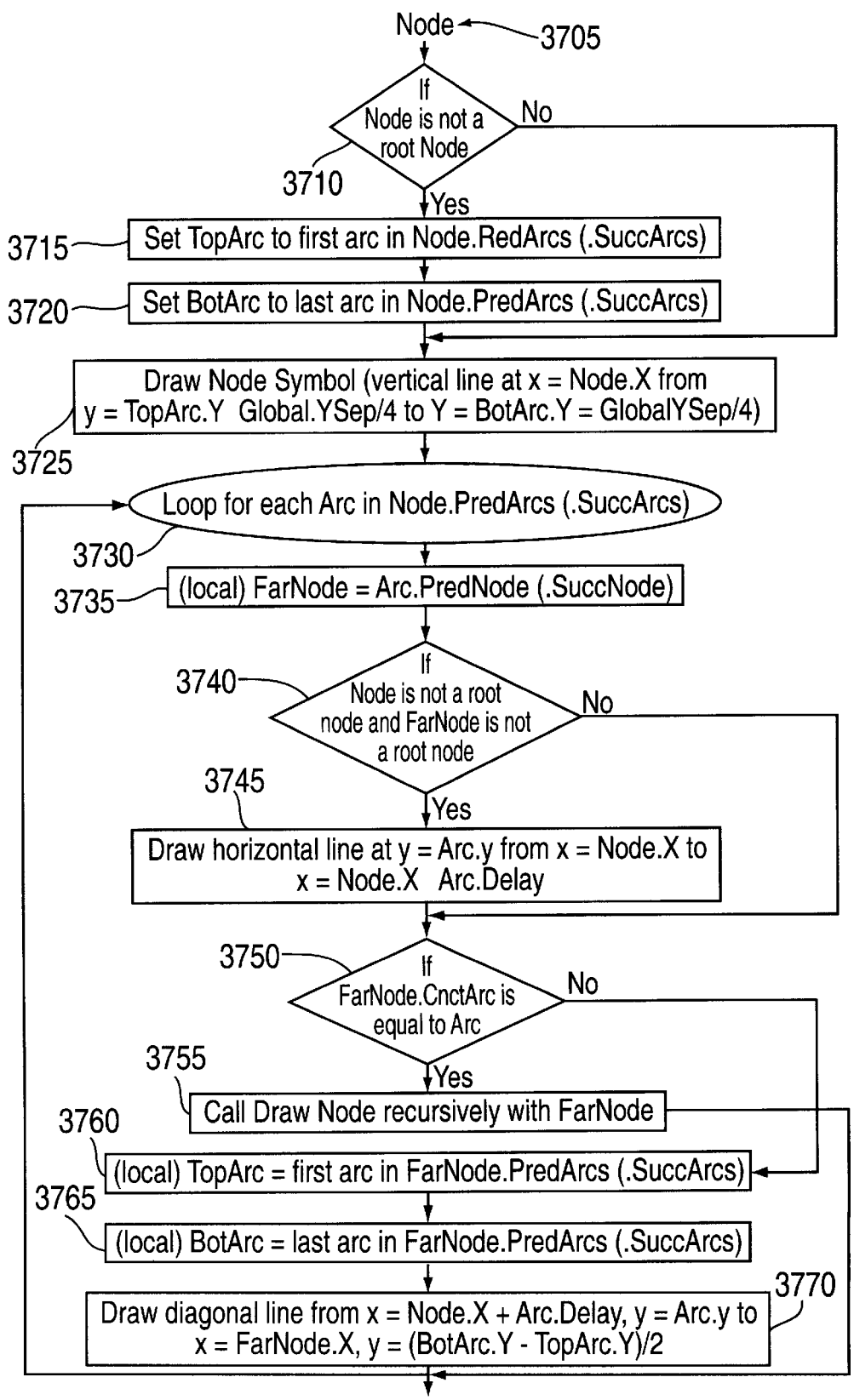
FIG. 11 is a flow chart which shows steps for recursively drawing a node and its children.

FIG. 10(a) is a flow chart showing steps performed by the described embodiment to determine the placement of cells and arcs in the delay chart. As will be understood, the horizontal or x placement of a pin or port corresponds directly to the delay of the pin or port.

DAG Layout Methods

FIG. 10(a) is a flow chart which shows steps for computing the layout of a DAG. The input to this method is a DAG. The layout methods calculate the X and Y placement values for the nodes and arcs in the DAG. In one embodiment, the Y values increase towards the bottom of the delay chart, and the X values increase in the direction of the layout. For example, for right-to-left layout the right edge of the chart has x equal to zero and x grows larger towards the left.

It will be apparent to one skilled in the art that the methods of FIGS. 10(a)–10(d) can be used to lay out a DAG in either the right-toleft or left-to-right directions. The only difference is the direction in which pointers are traced. For instance, in the right-to-left direction, a node checks its predecessor arcs to find its child nodes. In the left-toright direction, a node checks its successor arcs to find its child nodes. For the sake of conciseness, the methods shown in FIGS. 10(a)–10(d) show the structure used to implement a right-to-left layout. When the left-to-right layout differs, the right-to-left structure is followed by the structure used to implement a left-to-right layout in parentheses. In some cases, the term "children" is used when summarizing the effects of a method. Children refers to either the predecessor or successor nodes or arcs of a node or arc. Thus, the "children" of a node or arc are all those nodes or arcs which must be laid out before the node or arc in question can be laid out.

In one embodiment, the nodes which represent timing endpoints of the circuit may be treated specially. If such nodes are connected to zero length arcs, these arcs are drawn as if they had a length of 0.9 so that the timing endpoints can be displayed individually (see, e.g., FIGS. 18 and 20).

Figure 10B:
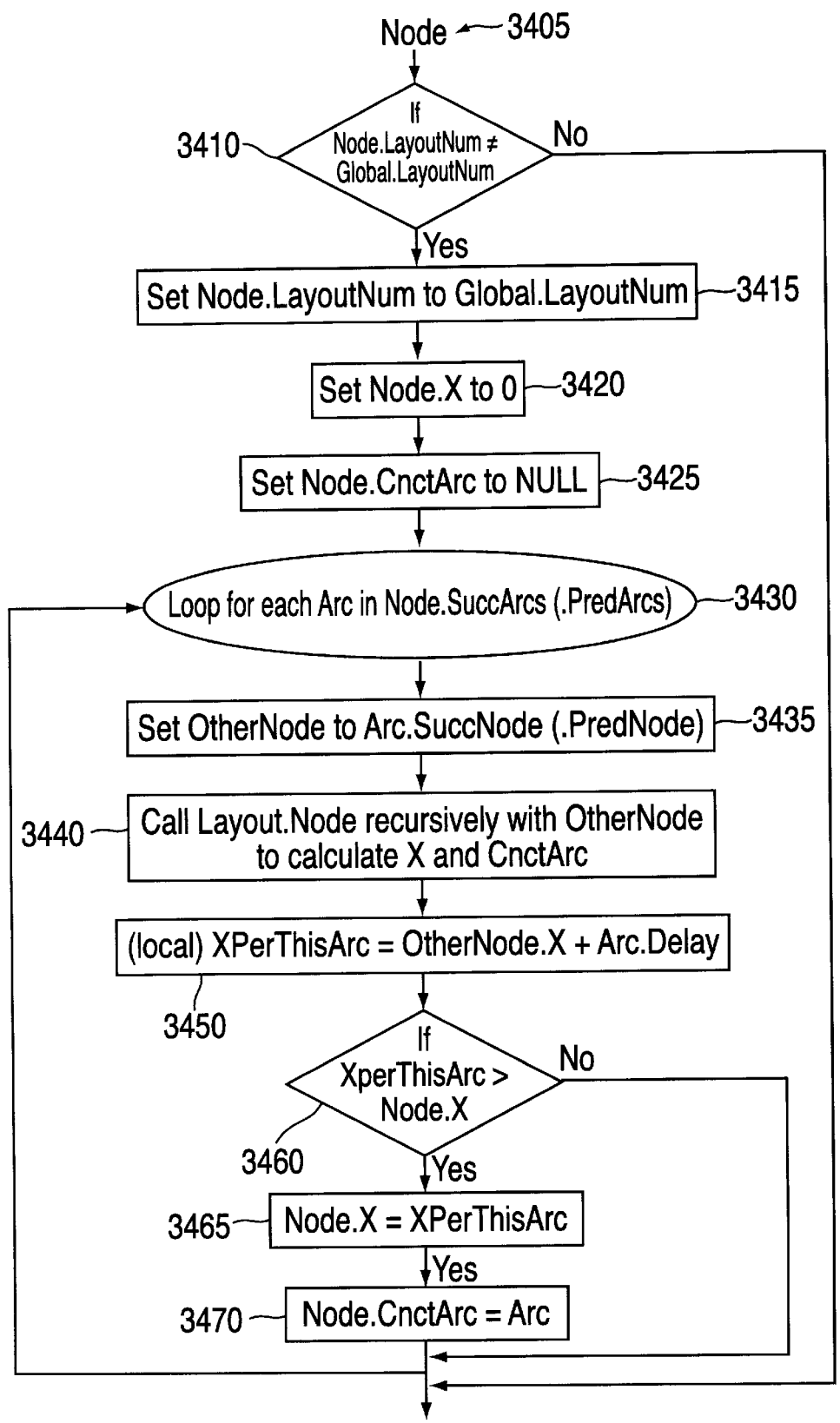
FIG. 10(b) is a flow chart which shows steps for recursively laying out a node and its children.

Step 3305 increments the Global.LayoutNum for this DAG. The layout number is the number of times that this graph has been laid out. In one embodiment, the layout number is used to determine if a node has already been laid out. In an alternate embodiment, a flag could be used on each node, but then this flag would need to be cleared before each new layout began. Step 3310 calls the routine Layout Node with Global.FwdRootNode (Global.BkwdRootNode for left-to-right) as its parameter to calculate X and CnctArc values for all nodes. Steps for Layout Node are shown in FIG. 10(b). Step 3315 initializes Global.NextY to 0. Step 3320 then sets Global.YSep to a desired value.

In one embodiment, this value is 1000. It will be apparent to one skilled in the art that the X and Y coordinates are relative, and that a conventional windowing system may scale these coordinates to fit on the actual screen coordinates. Step 3325 then calls Layout Adjacent Arcs with Global.BkwdRootNode (Global.FwdRootNode) to calculate Y values for all arcs.

At the end of this routine, the DAG will have been laid out and all nodes and arcs will have X and Y values respectively.

Layout Node

FIG. 10(b) is a flow chart which shows steps for recursively laying out a node and its children. The input to the method is a node 3405.

Step 3410 checks to see if the layout number of the node 3405 is equal to the global layout number for the graph. If so, then the node 3405 has not yet been laid out, and the method returns. Note that this strategy also implicitly breaks cycles, were the graph to be cyclic, rather than acyclic. Step 3415 then sets the node's 3405 layout number to be the global layout number, step 3420 initializes Node.X to be 0, and step 3425 initializes the node's 3405 connected arc to be null, or not pointing to anything.

Loop 3430 loops over each arc in the successor (predecessor) arc list for the node 3405. Step 3435 then sets a local variable, OtherNode, to point to the successor (predecessor) node for the arc. Step 3440 then calls Layout Node recursively with OtherNode as the argument. This call will calculate the X and CnctArc values for OtherNode.

After the recursive call returns, local variable XPerThisArc is set to OtherNode.X+Arc.Delay in step 3450. Step 3460 checks to see if XPerThisArc is greater than the X value for node 3405 and if so, replaces Node's 3405 X value with the value of XPerThisArc and step 3470 sets the connected arc for node 3405 to be the current arc. Thus, at the end of the loop Node.X will have the maximum possible X value. At the end of this routine, node 3405 and all of its children will have been laid out.

Layout Adjacent Arcs

Figure 10C:
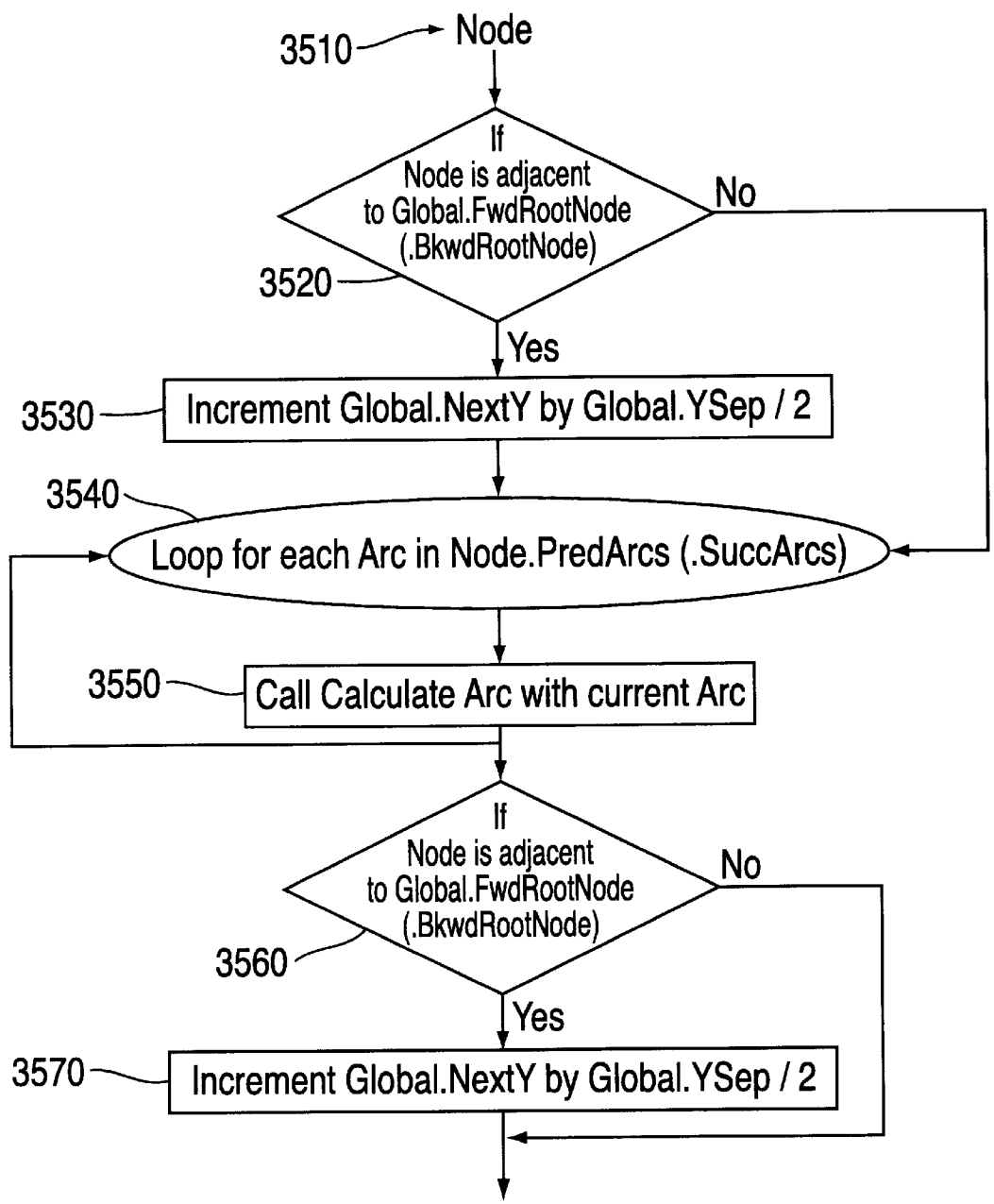
FIG. 10(c) is a flow chart which shows steps for laying out the arcs which are adjacent to a node.

FIG. 10(c) is a flow chart which shows steps for laying out the arcs that are adjacent to a node. This method calculates the Y values for arcs. The input to the method is a node 3510. Step 3520 checks to see if node 3510 is adjacent to Global.FwdRootNode (Global.BkwdRootNode). If so, step 3530 increments Global.NextY by Global.YSep/2 to allow some extra space between nodes on the far edge of the chart.

Figure 10D:
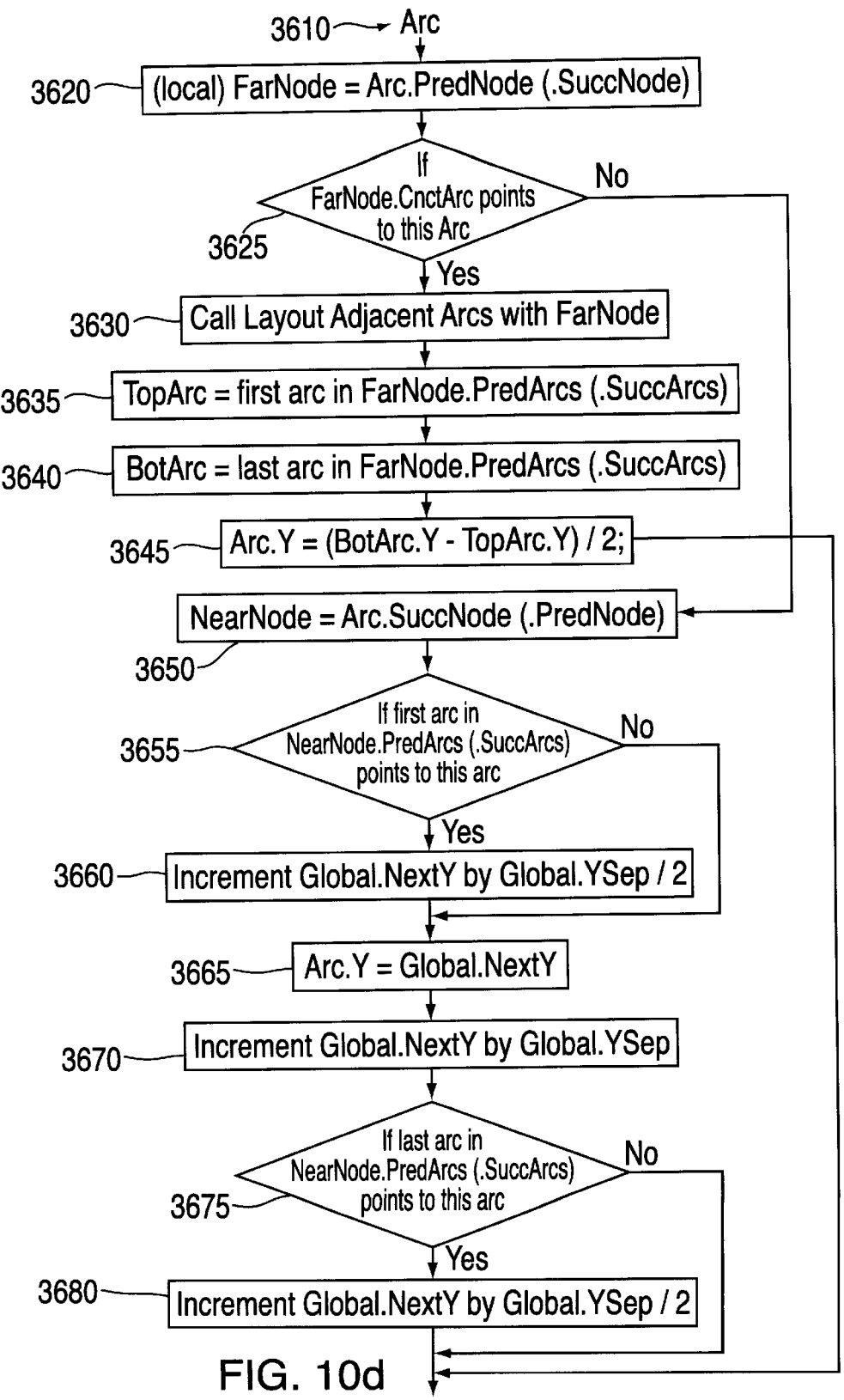
FIG. 10(d) is a flow chart which shows steps for calculating the Y value for an arc.

Loop 3540 loops over each arc in the predecessor (successor) arc list for node 3510. Step 3550 calls CalculateArcY with the current arc as the parameter. Steps for CalculateArcY are shown in FIG. 10(d). After Loop 3540 completes, step 3560 checks to see if node 3510 is adjacent to Global.FwdRootNode (Global.BkwdRootNode). If so, step 3570 increments Global.NextY by Global.YSep/2 to allow some extra space between nodes on the far edge of the chart.

Calculate Arc Y

FIG. 10(d) is a flow chart which shows steps for calculating the Y value for an arc. The input to this method is an arc 3610. Step 3620 sets the local variable FarNode to point to the predecessor (successor) node for this arc 3610. Step 3625 checks to see if FarNode.CnctArc points to this arc 3610. If so, the method continues with step 3630, which recursively calls LayoutAdjacentArcs with FarNode as the argument. When LayoutAdjacentArcs returns, the arcs adjacent to FarNode have been laid out and step 3635 sets local variable TopArc to be the first arc in FarNode's predecessor (successor) arc list. Likewise, step 3640 sets local variable BotArc to be the last arc in FarNode's predecessor (successor) arc list. Arc's 3610 Y value is set to be the average of TopArc's and BotArc's Y values, (BotArc.Y−TopArc.Y)/2. If FarNode CnctArc did not point to this arc 3610 then the method skips to step 3650 which sets NearNode to arc's 3610 successor (predecessor) node. Step 3655 checks to see if the first arc in NearNode's predecessor (successor) arc list points to arc 3610. If so, step 3660 increments Global.NextY by Global.YSep/2 to allow for extra space. In either case, in step 3665, Arc.Y is set to Global.NextY.

Step 3670 increments Global.NextY by Global.YSep. Step 3675 checks to see if the last arc in NearNode's predecessor (successor) arc list points to this arc 3610 and if so step 3680 increments Global.NextY by Global.YSep/2 to allow for extra space.

Draw Node

FIG. 11 is a flow chart which shows steps for recursively drawing a node and its children. The input to FIG. 11 is a node 3705. Step 3710 checks to see if node 3705 is not a root node in which case TopArc is set to the first arc in node's 3705 predecessor (successor) arcs list in step 3715 and BotArc is set to the last arc in node s 3705 predecessor (successor) arcs list in step 3720. Step 3725 draws a symbol for node 3705. In one embodiment the symbol may be a vertical line located at x=Node.X which extends between y values TopArc.Y−Global.YSep/4 and BotArc.Y+Global.YSep/4. In an alternate embodiment, this vertical line may have its x value moved slightly to the left to accommodate a node symbol which is displayed central to the vertical line and with its right edge at Node.X. If node 3705 is a root node no symbol is drawn.

Next, loop 3730 loops over each arc in node's 3705 predecessor (successor) arcs list. In each iteration of the loop, the variable Arc is set to the current loop variable. Step 3735 sets local variable FarNode to be Arc.PredNode (Arc.SuccNode). Step 3740 checks to see if node 3705 is not a root node and FarNode is not a root node, in which case step 3745 draws a horizontal line for Arc at y=Arc.y from x=Node.X to x=Node.X+Arc.Delay. In an alternate embodiment, the horizontal line for Arc may not extend quite as far to the right to allow room for a larger node symbol.

Next, step 3750 checks to see if FarNode.CnctArc is equal to Arc, and if so step 3755 calls DrawNode recursively with FarNode as its parameter to draw FarNode and its children. Otherwise, step 3760 sets local variable TopArc to the first arc in FarNode.PredArcs (.SuccArcs), and step 3765 sets local variable BotArc to the last arc in FarNode.PredArcs (.SuccArcs). Finally, step 3770 draws the diagonal between Arc and FarNode with coordinates starting at x=Node.X+Arc.Delay, y=Arc.y and ending at coordinates x=FarNode.X y=(BotArc.Y−TopArc.Y)/2. In an alternate embodiment, if Node.X+Arc.Delay and FarNode.X are the same, the diagonal is drawn so that it is offset along the arc a little bit so that it does not appear vertical.

Performance Enhancements

In one embodiment, it may be convenient to store the diagonal lines in a separate data structure. This allows the diagonals to be drawn first so that they appear to be drawn underneath the nodes and arcs. In addition, it will be apparent to one skilled in the art that if the diagonals are stored in a tree structure, a subset of the diagonals can be accessed quickly if only a portion of the DAG must be redrawn, for instance when the user scrolls the display. In one embodiment, the arcs which connect to diagonal lines are stored in a tree structure in which the tree is arranged by the range of Y values that the diagonal spans. Thus, arcs connected to diagonals that only appear in the top half of the display will be stored in the same half of the tree. Since all of the coordinates for a diagonal can be accessed through an arc and the nodes to which it is connected, only a pointer to the arc needs to be stored in the tree.

In one embodiment, the above tree data structure is built by using the method shown in FIG. 11 to compute where the diagonals must be drawn. However, nodes and arcs are not drawn. Instead of drawing diagonals in step 3770, the arc is stored in the diagonals tree for later use. Then, when the DAG is to be drawn, the diagonals tree is traversed and the diagonals are drawn. Next, the method of FIG. 11 is used to draw the nodes and arcs, but step 3770 is skipped as the diagonals have already been drawn. It will be apparent to one skilled in the art that since the nodes and arcs are stored in a tree structure, it is also possible for the method of FIG. 11 to be bounded such that only a portion of the DAG is drawn if it is known that only that portion will fit on the display device of computer 100.

In one embodiment, it may also be convenient to store the minimum and maximum Y values of child arcs on a node. This allows the display algorithms to quickly traverse the DAG and determine the placement of all of a node s children. In one embodiment, if no children fit on the screen, the node is not drawn.

d. Merging

Figure 12A:
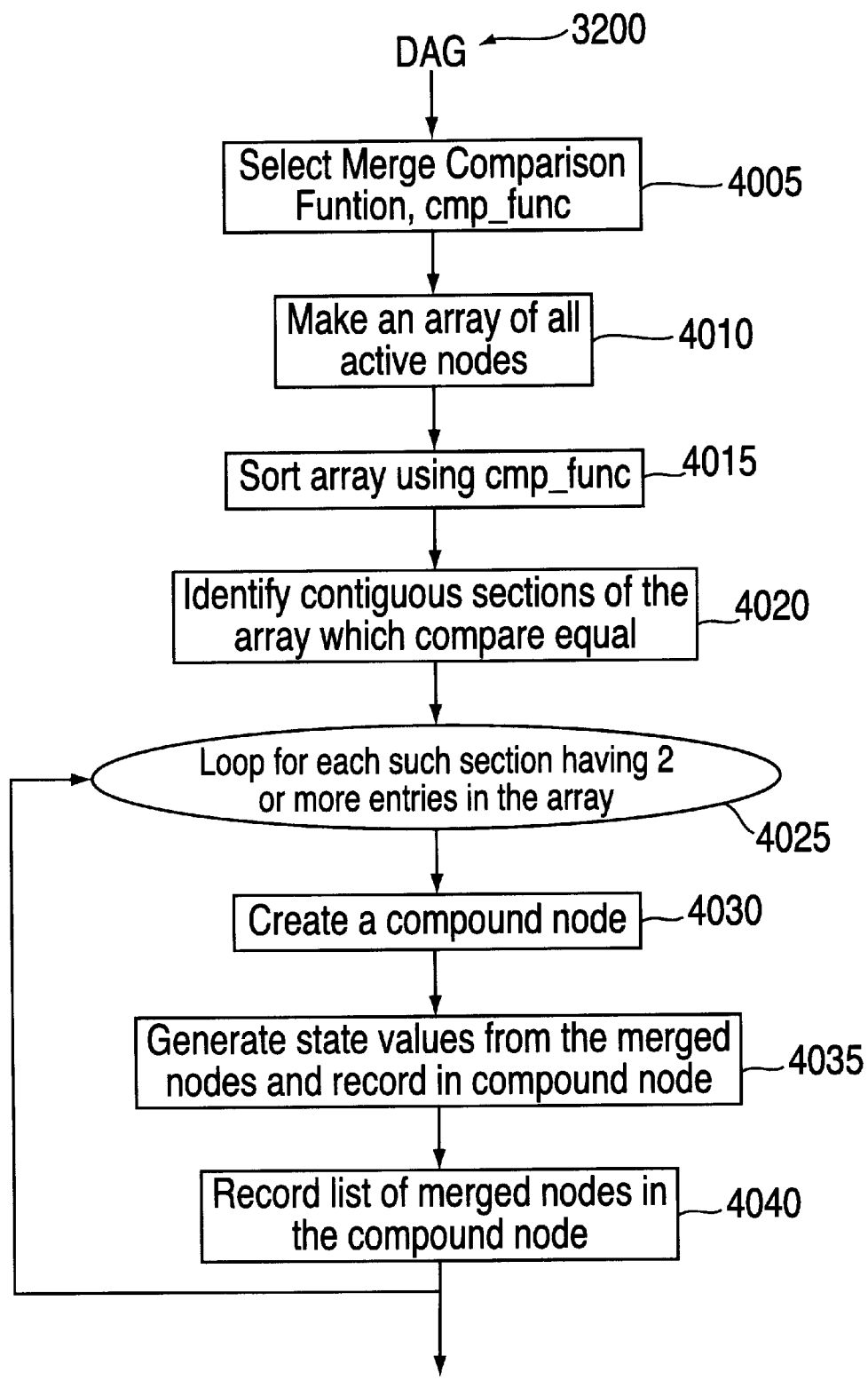
FIGS. 12(a)–12(c) are flow charts showing steps for merging nodes in the DAG.
Figure 12B:
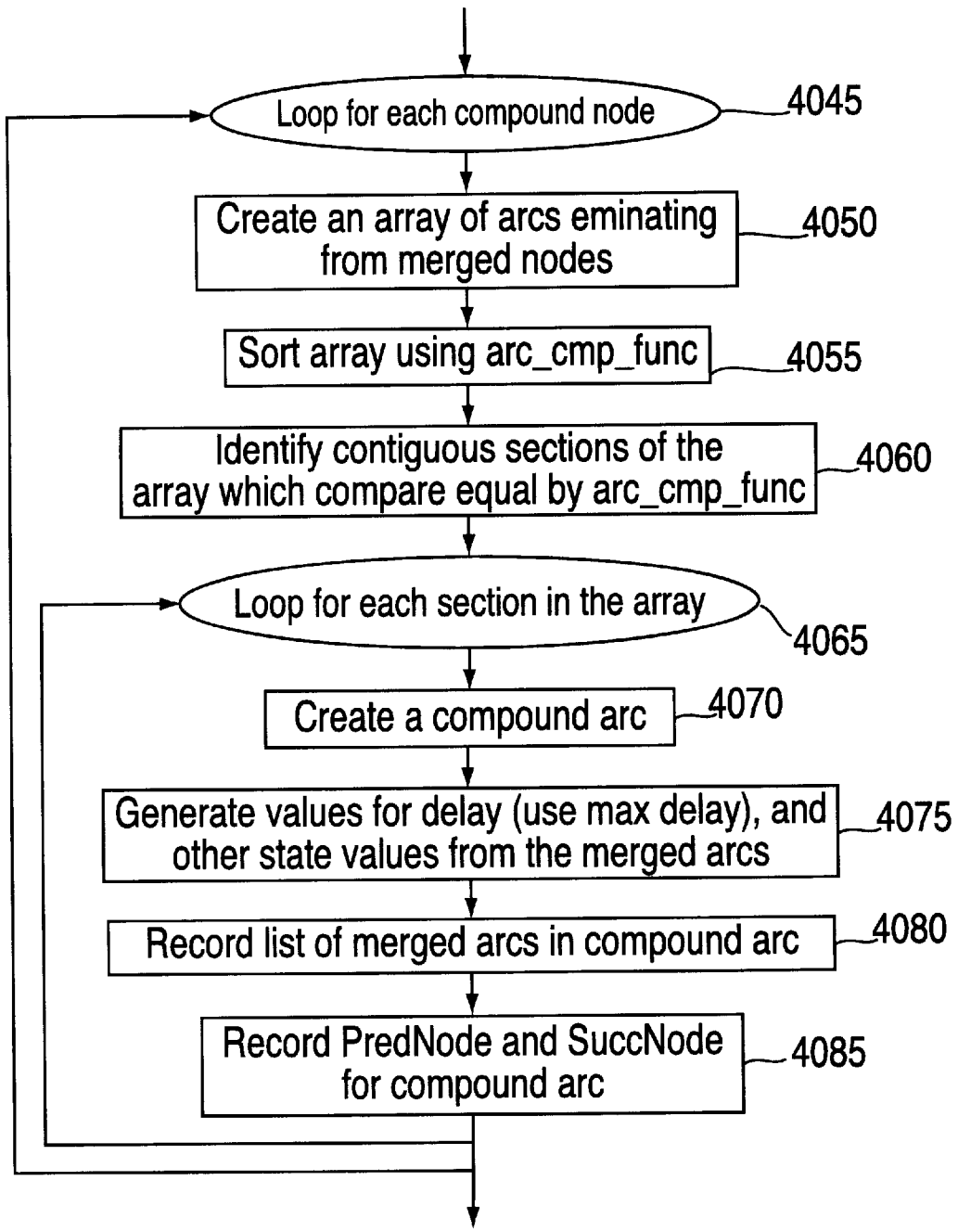
Figure 12C:
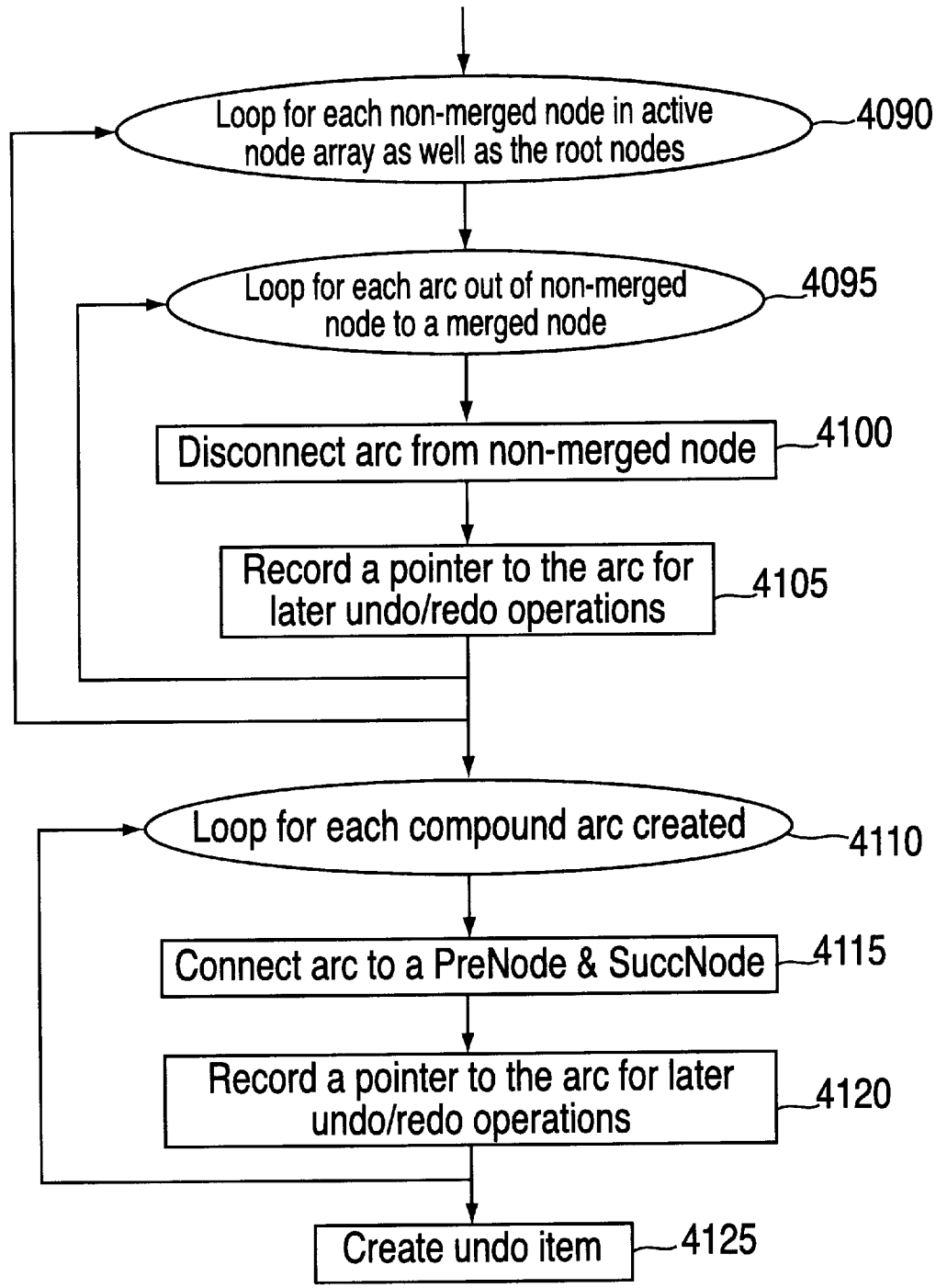
Figure 13A:
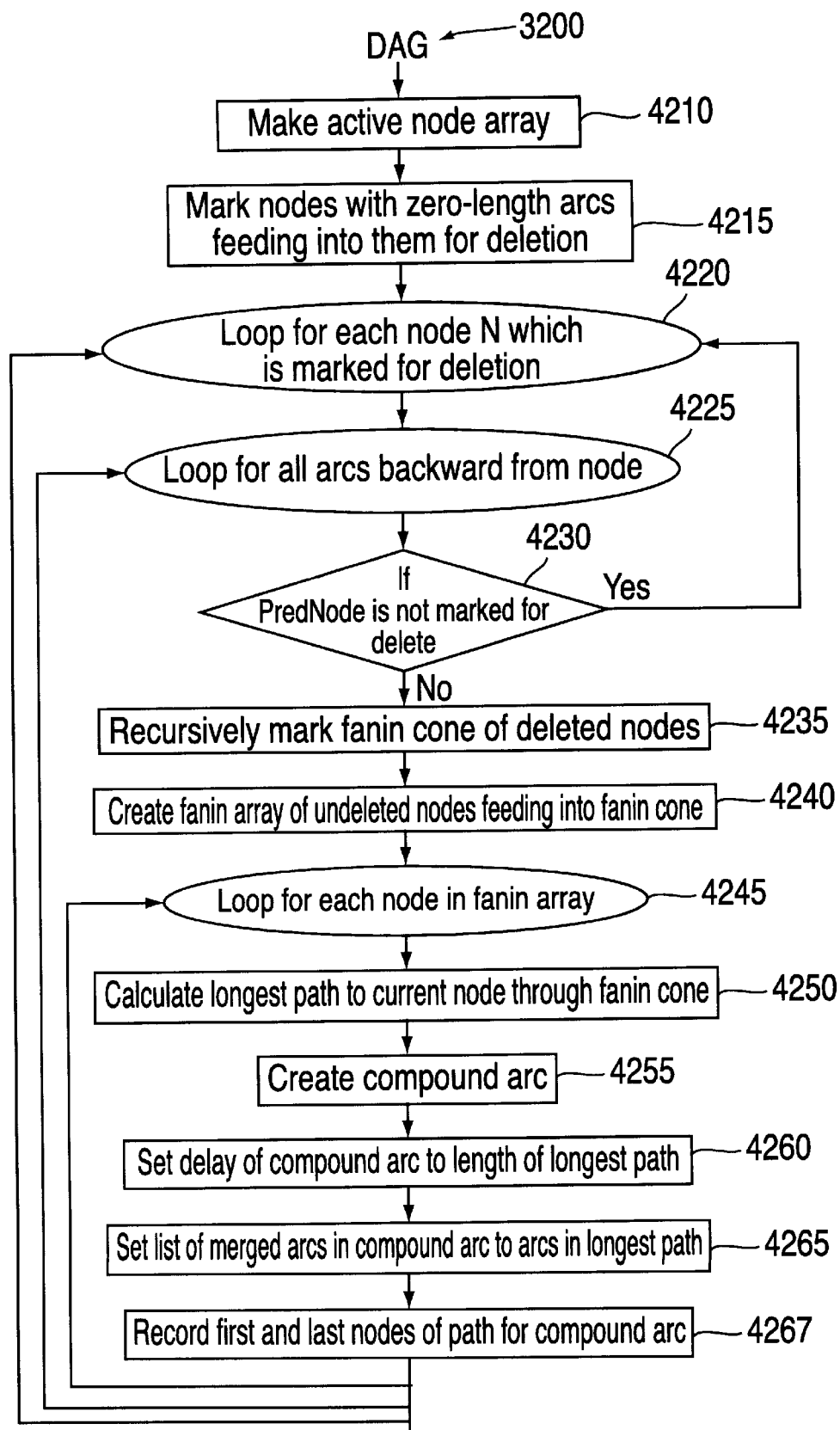
FIGS. 13(a) and 13(b) are flow charts showing steps for removing zero length arcs from the DAG.
Figure 13B:
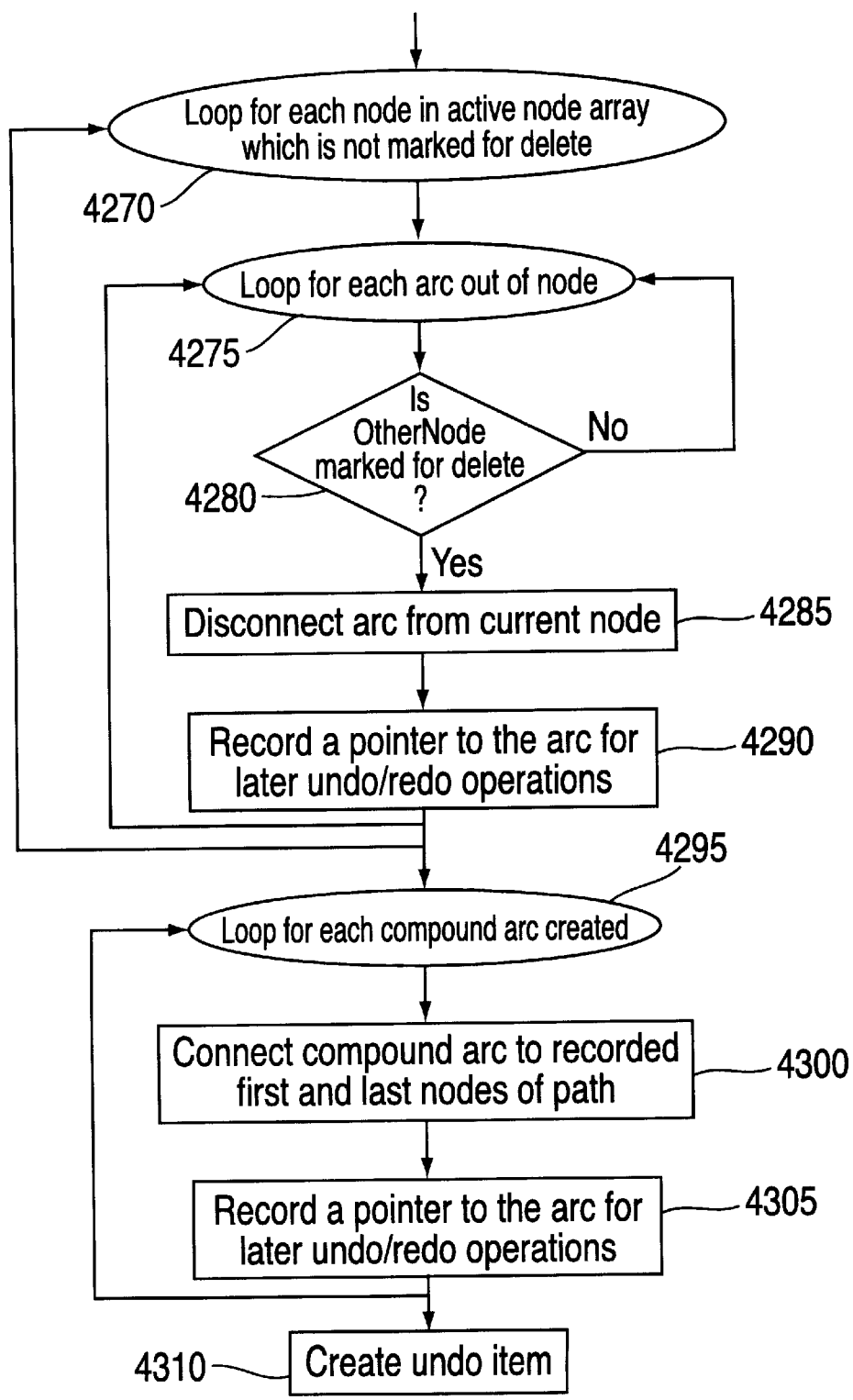

FIGS. 12(a)–12(c) are flow charts showing steps for merging nodes in the DAG. In the following discussion, a node that is the result of merging other nodes is called either a "merged node" or a "compound node." The input to FIG. 12 is a DAG 3200. Merging can be done using any comparison function for nodes. One skilled in the art will recognize that a standard comparison function can compare two nodes and return "0" if the nodes are the same, "−1" if the first node is ordered before the second node, and "1" if the first node is ordered after the second node. Thus, a list of nodes in the DAG can be sorted using a comparison function and nodes which are equal using the comparison function can be merged into a single node.

It will be apparent to one skilled in the art that many criteria can be used for the comparison function. For example, in one embodiment, the comparison function can be based on arrival or delay times of circuit elements. In another embodiment, the comparison function can be based on the cell-id of the source circuit element of a node, the HDL source-id of the source circuit element of a node, the arrival time of a node and the required time of a node. In an alternate embodiment, the comparison function can be based on the cell type of the source circuit element of a node, the HDL source-id (PTNN) of the source circuit element of a node, the arrival time of a node and the required time of a node. In a third embodiment, the comparison function can be based on the cell type of the source circuit element of a node, the HDL source-id of the source circuit element of a node, the arrival time of a node or the required time of a node. It will be apparent to one skilled in the art that any criteria can be used to compare nodes for merging using the following method as long as the comparison function involves delay.

The steps described below include references to root nodes. It will be apparent to a person of ordinary skill in the art that the use of root nodes is not required to implement the present invention and that not all embodiments of the invention will use root nodes. Step 4005 of FIG. 12(*a*) selects the merge comparison function, cmp_func, to be used for this merge. This selection can be made automatically or at the direction of the designer. Step 4010 then creates an array of all of the active nodes in the DAG. The active nodes are all nodes currently in the graph which have not been previously merged or deleted and are not root nodes. Step 4015 sorts the array using cmp_func. Step 4020 then identifies contiguous sections of the array which compare equal using cmp_func.

Loop 4025 loops over each such section having two or more entries in the array which was identified in step 4020. Step 4030 creates a compound node for each such section. Step 4035 then generates state values from the merged nodes and records those state values in the compound node. In one embodiment, the state values are the cell-type, the cell-id, and the source-id of the circuit elements from which the nodes in the DAG were created. It will be apparent to one skilled in the art that other values may be stored as well. Step 4040 records a list of merged nodes in the compound node. At the end of loop 4025 a new compound node has been created for each group of merged nodes.

In FIG. 12(*b*), loop 4045 and loop 4065 operate together to create compound arcs for each of the new compound nodes. Loop 4045 loops over each of the new compound nodes. Step 4050 creates an array of arcs emanating from the merged node. These arcs connect to the nodes that are merged to create the new merged node. The arcs in the array include those arcs which point forward to either a merged node or a non-merged node, as well as those arcs pointing backward to a non-merged node. Step 4055 then sorts the arc array created in step 4050 using an arc comparison function. Two arcs compare equal if both of their nodes compare equal using cmp_func. Step 4060 identifies contiguous sections of the arc array created in step 4055 in which the arcs sort equal.

Loop 4065 loops over each such section in the arc array and creates a compound arc in step 4070. In one embodiment, if the graph contains root nodes, and the arc array contains a section of arcs pointing to a root node, as well as a section of arcs pointing to a non-root node, only the compound arc pointing to the non-root node is created. This process ensures that only the DAG startpoints and endpoints point to the root nodes. Step 4075 generates the new delay value for the compound arc, which is the maximum delay value of any arc in the group. Step 4075 also records other state values from the merged arcs. In one embodiment, such state values may be the source-id of the original circuit element from which the arc was derived. Step 4080 then records the list of merged equivalent arcs in new compound arc. Step 4085 records the PredNode and SuccNode for the compound arc. These are the PredNode and SuccNode for the original merged arcs.

In FIG. 12(*c*), loop 4090 disconnects the nodes which were merged into compound nodes from the DAG. Loop 4090 loops over each non-merged node in active node array as well as the root nodes. Nested loop 4095 loops over each arc which connects the current non-merged node to a merged node. Step 4100 disconnects the arc from the non-merged node. Step 4105 optionally records a pointer to the arc for later undo/redo operations.

Loop 4110 connects the new compound nodes into the DAG. It loops over each new compound arc created to by loop 4045 and loop 4065 to connect the new arc to the appropriate nodes in the DAG. Step 4115 connects the compound arc to the PredNode and SuccNode which were recorded in step 4085. The compound arc is connected by adding the compound arc to the PredNode's SuccArc list, and adding the compound arc to the SuccNode's PredArc list. Step 4120 optionally records a pointer to the compound arc for later undo/redo operations.

Step 4125 optionally creates an undo item by storing lists of the nodes and arcs created, and the pointers mentioned above. At the end of this process, nodes which sort equal using the comparison function have been merged.

e. Elimination of Zero-length Arcs

A Gtech circuit, for example, contains many delay segments that are zero time units long. That is, there are many pins where the delay to preceding pins is zero. These delay segments and pins cannot be shown in the delay chart (if they were shown, symbols would be displayed on top of each other). Therefore, display software 170 optionally modifies the circuit to remove zero-length segments before the delay chart is displayed, while maintaining the same logical connectivity.

Zero Length Arc Deletion Method

FIG. 13 is a flow chart showing steps for removing zero length arcs from the DAG. The steps of this method remove the zero length arcs and the nodes which these arcs feed into. The input to FIG. 13 is the DAG 3200.

Step 4210 makes an array of all of the active nodes in the DAG. The active nodes are those nodes which have not been previously deleted or merged and are not root nodes. Step 4215 marks all of the nodes in the array which have zero-length arcs feeding into them for deletion. In one embodiment, zero length arcs which feed into nodes which represent timing endpoints in the original circuit are treated specially. Timing endpoint nodes are treated specially because it may be important to the user to view timing endpoints as distinct nodes. In one embodiment, if the delay of arcs feeding timing endpoint nodes is "0," it is adjusted to be 0.9 while the steps of FIG. 13(*b*) are executed so that the timing endpoint nodes will not be deleted by this method.

In one embodiment, arcs feeding into or out of root nodes are also treated specially. Although such arcs always have length zero, the root nodes are never marked for deletion because they are only a part of the DAG for convenience and will not be displayed.

Loop 4220 then loops over each node in the active node array which was not marked by step 4215. As each node is processed it is called the current node. Nested loop 4225 loops over all arcs which feed into the current node. As each arc is processed, it is called the current arc. If the PredNode of the current arc is not marked for deletion, step 4230 skips to the next iteration of loop 4220.

Otherwise, step 4235 recursively marks the fanin cone of deleted nodes which feed into the current node without going through an undeleted node. Effectively, this step identifies a connected sub-graph of deleted nodes. Step 4240 then uses the deleted fanin cone to create a fanin array of undeleted nodes which directly feed into nodes in the fanin cone identified in step 4235.

Loop 4245 then loops over each undeleted node in the fanin array found in step 4240. Step 4250 calculates the longest path to the current node from a node in the fanin array through the fanin cone. This calculation can be done using a longest-path graph algorithm, which is well-known to persons skilled in the art. For example, see *Introduction to Algorithms*, by Cormen, Leiserson and Rivest, 1990 MIT Press, ISBN 0-07-013143-0, Chapter 25, which is hereby incorporated by reference. Step 4255 creates a compound arc, and step 4260 sets the delay of the compound arc to the length of the longest path found in step 4250. Step 4265 sets the list of merged arcs in the compound arc to be the arcs from the longest path of step 4250. Step 4267 then sets the first node of the longest path to be the PredNode for the compound arc and the last node of the longest path to be the SuccNode for the compound arc.

In FIG. 13(*b*), loop 4270 disconnects the deleted nodes from the graph. It loops over each node in active node array which is not marked for deletion; this node is called the current node. Nested loop 4275 then loops over each arc connected to the current node. If the other node that the arc is connected to is a node which is not marked for deletion, step 4280 skips to the next iteration of loop 4275. Otherwise, step 4285 disconnects the arc from the current node, and step 4290 optionally records a pointer to the arc for later undo/redo operations.

Loop 4295 connects the new compound arcs into the DAG. It loops over each compound arc created in step 4255. Step 4300 connects the compound arc into the DAG by setting the compound arc's successor node to include the compound arc in its PredArcs list, and the compound arc's predecessor node to include the compound arc in its SuccArcs list. Step 4305 optionally records a pointer to the compound arc for later undo/redo operations.

Finally, step 4310 optionally creates an undo item which stores lists of compound arcs created, nodes deleted, and the pointers mentioned above. At the end of this process, zero length arcs, except for those ending at a timing endpoint or connected to a root node, have been removed from the graph.

f. An Example of Delay Chart Generation

Figure 15:
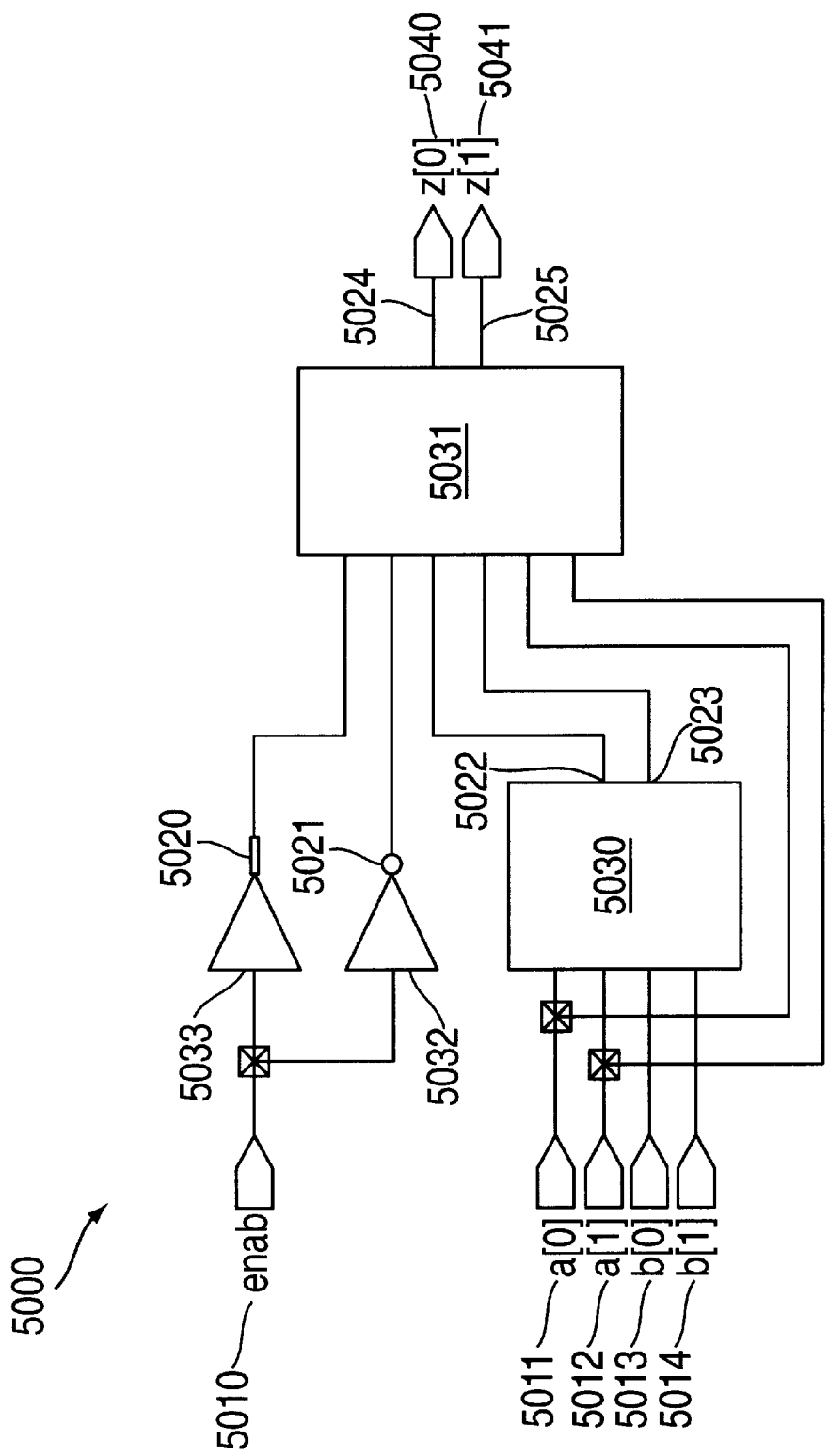
FIG. 15 is a block diagram of an example circuit.

FIG. 14 is an example of HDL source code. FIG. 15 is a block diagram of an example circuit 5000 corresponding to the HDL source code of FIG. 14. The circuit contains a 2-bit adder 5030 having output pins 5022 and 5023, and a selector 5031 having output pins 5025 and 5026. In addition, circuit 5000 contains a buffer 5033 having output pin 5020 and an inverter 5032 having output pin 5021. The circuit has five inputs enab 5010, a[0] 5011, a[1] 5012, b[0] 5013, b[1] 5014, which are the timing startpoints, and two outputs z[0] 5040 and z[1] 5041, which are the timing endpoints.

Creating a DAG from a Circuit Representation

Figure 16:
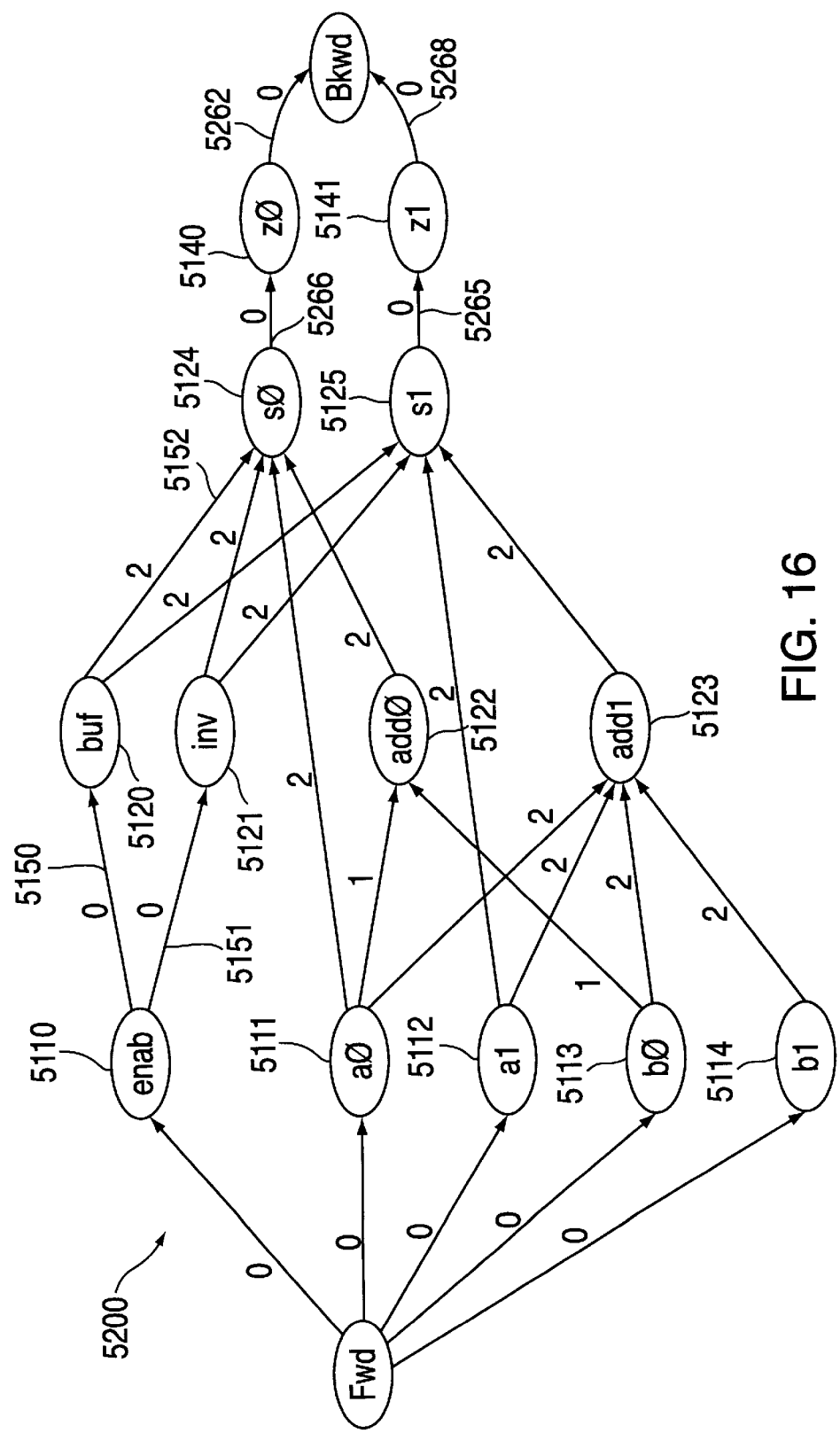
FIG. 16 is a block diagram of the DAG for the circuit of FIG. 15.

FIG. 16 is a diagram of the DAG 5100 for the circuit 5000 of FIG. 15. The DAG has thirteen nodes. Node 5110, node 5111, node 5112, node 5113, and node 5114 correspond to the inputs of circuit 5000. Node 5140 and node 5141 correspond to the outputs of circuit 5000. Node 5120, node 5121, node 5122, node 5123, node 5124, and node 5125 correspond to the output pins of buffer 5033, inverter 5032, adder 5030, and selector 5031. The delays on the arcs of DAG 5100 correspond to the delays between the pins of circuit 5000. DAG 5100 is created from circuit 5000 according the steps shown in FIG. 8(*a*) and FIG. 8(*b*).

Removing Zero Delay Arcs from the DAG

Figure 17:
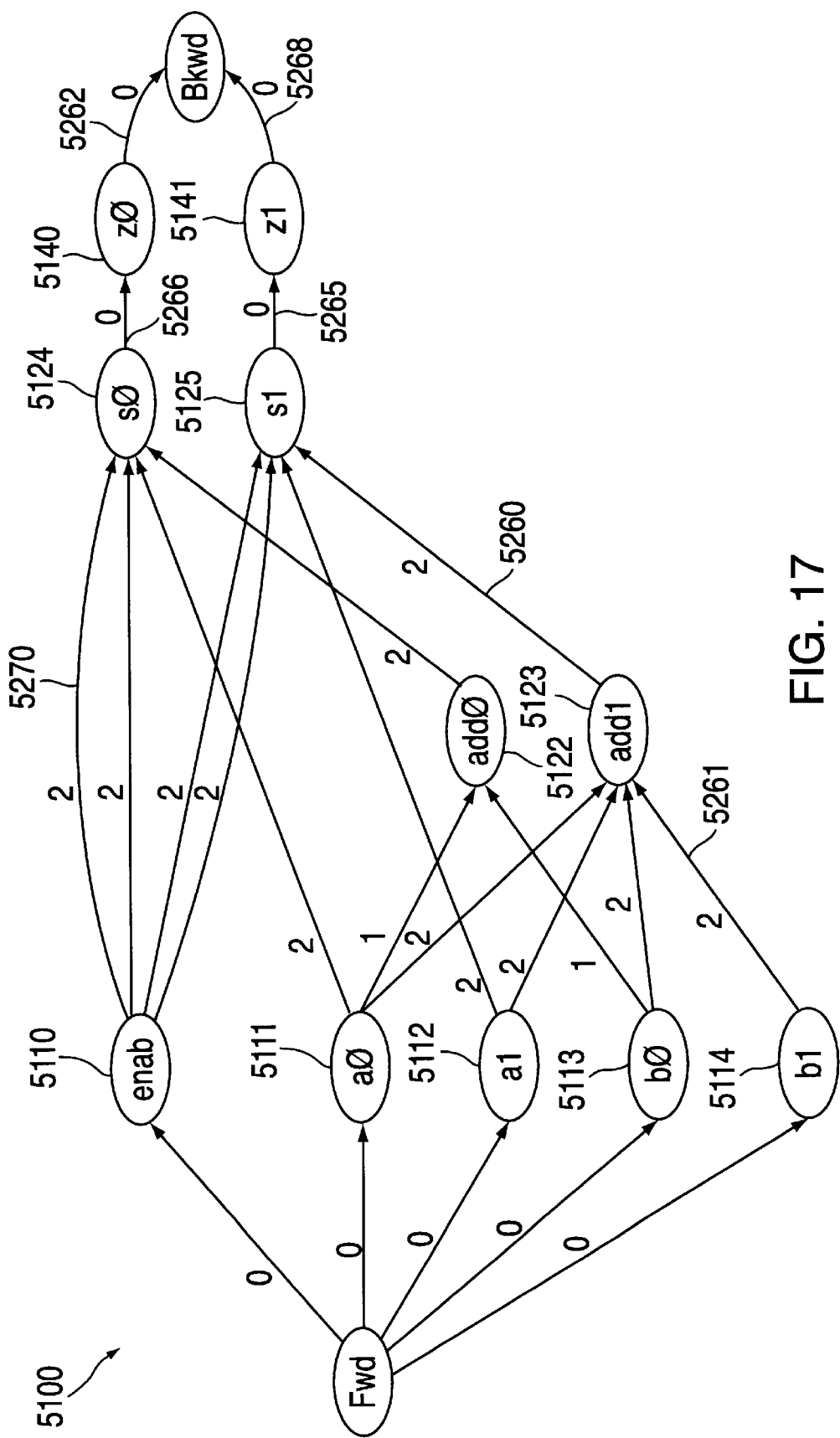
FIG. 17 is a block diagram of the DAG of FIG. 16 after the zero delay arcs and associated nodes have been removed.

FIG. 17 is a diagram of the DAG of FIG. 16 after the zero delay arcs and associated nodes have been removed. Note that arc 5150 and arc 5151 have been removed, along with node 5120 and node 5121 which are fed by the zero delay arcs.

The zero delay arcs are removed using the steps shown in FIGS. 13(*a*) and 13(*b*). Since arc 5150 and arc 5151 are zero length, node 5120 and node 5121 are marked for deletion in step 4215. Loop 4220 loops over all of the unmarked nodes in the DAG. When node 5125 S0 is encountered, loop 4225 traces arc 5152 to node 5120. Since node 5120 is marked for deletion, step 4240 creates a fanin array consisting of node 5110, enab. Loop 4245 processes node 5110, and step 4250 finds the longest path from node 5110, enab, through the fanin cone to node 5124. This path has length 2 and goes from node 5510 enab, through fanin cone node 5120 to node 5125. Step 4255 creates a compound arc 5270, and sets its delay to 2. Step 4265 sets the list of merged arcs to be arc 5150 and arc 5152, and step 4267 records node 5110 and node 5124 as the first and last nodes of the path for the compound arc 5270.

Loop 4270 then loops over the unmarked nodes again. Nested loop 4275 loops over each arc out of the current node. When loop 4270 processes node 5110 enab and loop 4275 processes arc 5150, step 4285 disconnects node 5110 enab from arc 5150. Finally, loop 4295 processes the new compound arc 5270 (FIG. 42) and connects it to node 5124 and node 5110 enab.

Figure 18:
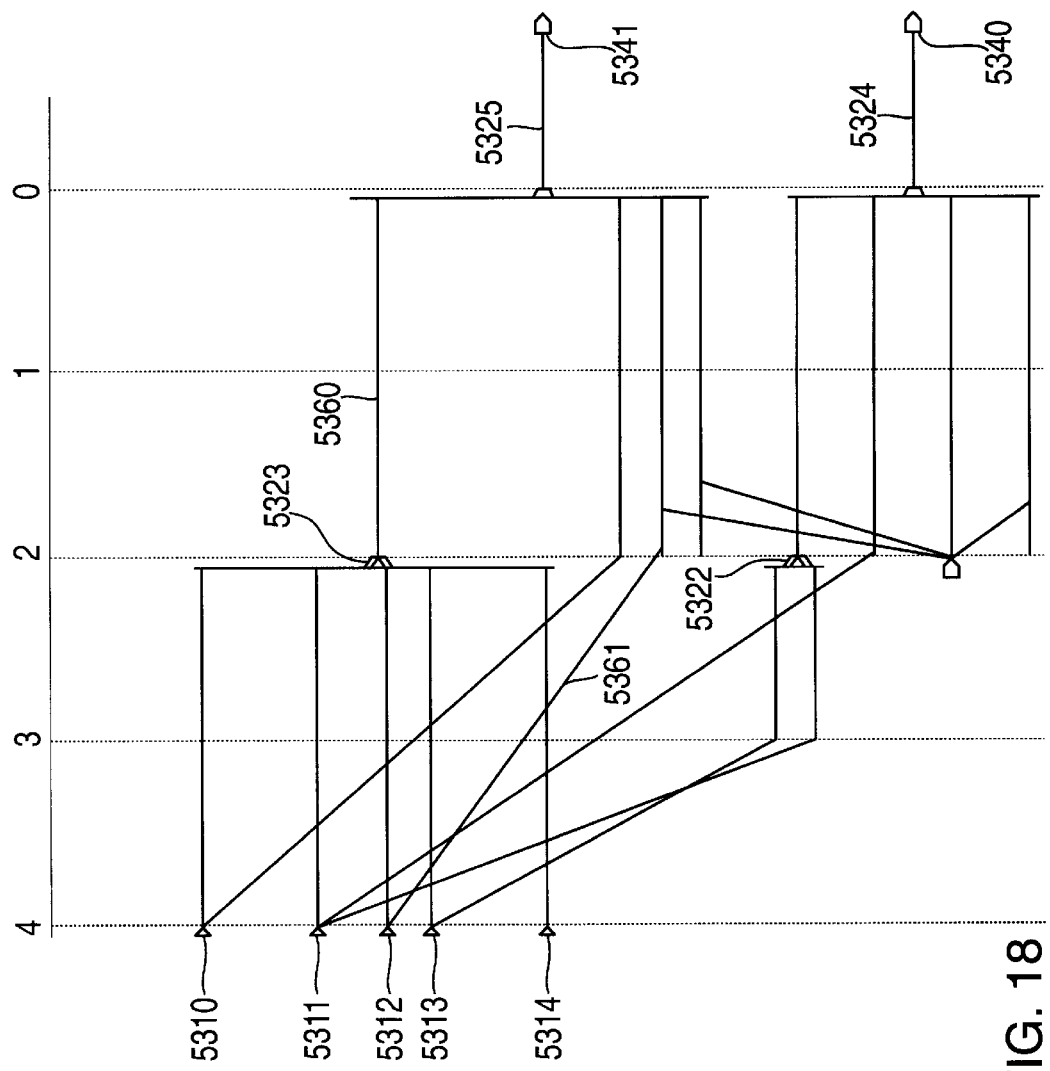
FIG. 18 is a sample delay chart laid out from the unmerged DAG of FIG. 17.

FIG. 18 is a sample delay chart laid out from the umnerged DAG of FIG. 17. Note for instance how arc 5270 of DAG 5200 shown in FIG. 17 is laid out as line 5360 in FIG. 18 from X value 0 to X value 2. Line 5361 which corresponds to arc 5261 is then laid out from X value 2 to X value 4 so that it precedes line 5360.

Merging Nodes in the DAG

Figure 19:
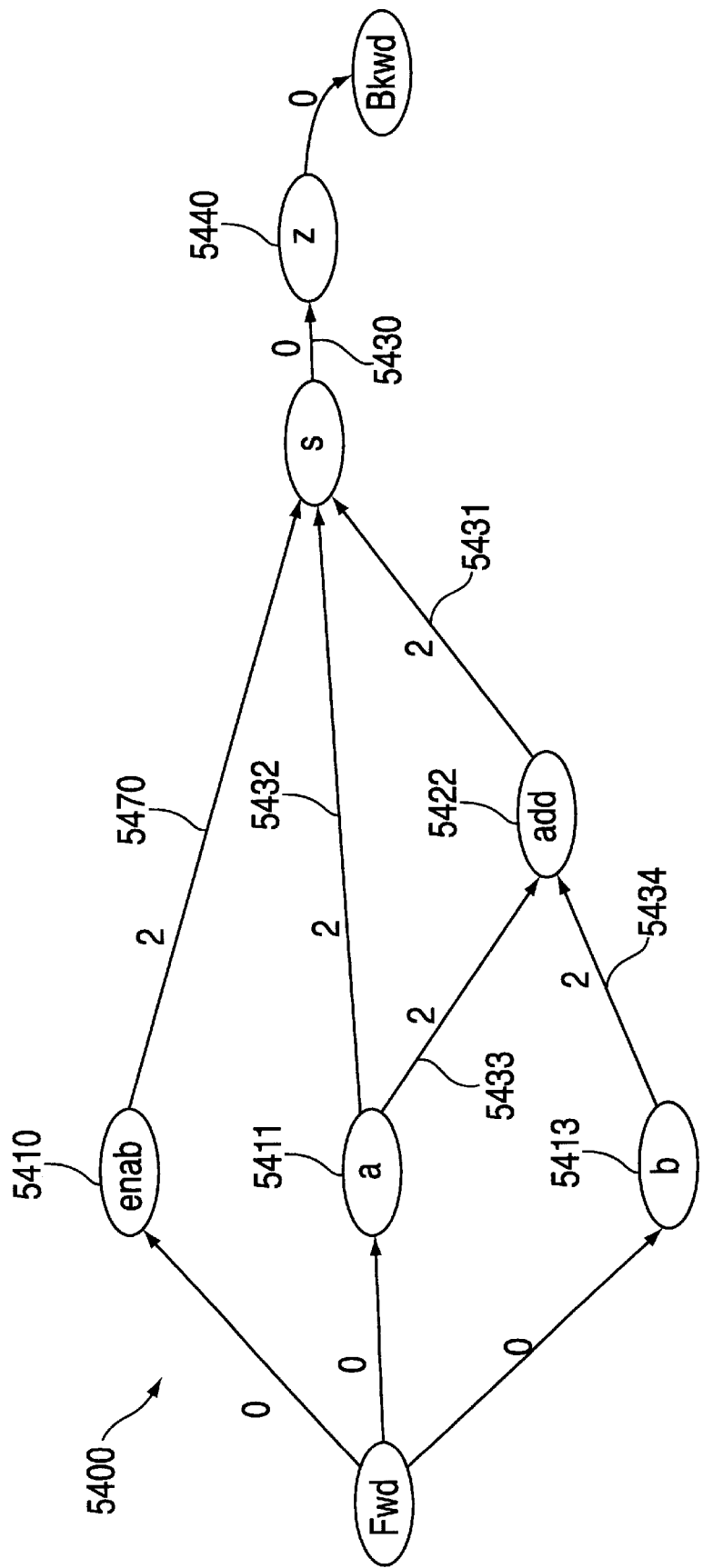
FIG. 19 is a block diagram of the DAG of FIG. 17 after merging.

FIG. 19 is a block diagram of the DAG of FIG. 17 after merging. The merge comparison function used in this example merges cells which have the same HDL source construct, the same required time, and the same source cell type. Thus, nodes which represent the bits of adder 5030 and selector 5031 are merged to become compound node 5422 and compound node 5425 respectively. In addition, bits of input and output values are merged.

The merging is accomplished using the steps shown in FIG. 12. In this example, the comparison function merges all nodes which come from the same source construct, have the same required time, and the same source cell type. These values are determined from that state information stored on the nodes. When the nodes of DAG 5200 are put into an array in step 4010 and sorted using the comparison function in step 4015, node 5140 z0 and node 5141 z1 sort equal using the comparison function as they both originate from port Z 5910 of the original HDL. Additionally, node 5124 s0 and node 5125 s1 sort equal, as they both originate from the selector 5031 inferred by the source HDL in line 5931 (see FIG. 14). Likewise node 5122 add0 and node 5123 add1, node 5111 a0 and node 5112 a1, node 5113 b0 and node 5114 b1 sort equal. Each of these sets of nodes which compare equal sort to contiguous sections of the array in step 4015 and these sections are identified in step 4020.

Next, loop 4025 loops over the array and processes, for example, the section containing node 5124 sO and node 5125 sl. Step 4030 creates a compound node 5425 s (FIG. 19), step 4035 records state values for this node such as the source construct, and step 4040 records the list of merged nodes (node 5124 and node 5125). Other merged nodes shown in FIG. 19 such as node 5440 z, node 5422 add, node 5411 a, and node 5413 b are created in the same fashion.

Next, loop 4045 loops over each compound node created in loop 4025. When node 5425 is processed, step 4050 creates an array of arcs emanating from the nodes that combine to create merged node 5425 and step 4055 sorts the array. Step 4060 identifies contiguous sections that sort equal. One such section includes arc 5266 and arc 5265 because both of these arcs terminate at nodes forming compound node 5440 z. Another section includes arc 5270, arc 5271, arc 5272, and arc 5273, as all of these arcs go backward from nodes forming compound node 5440 z to non-merged node 5110 enab. Loop 4065 loops over the section containing arc 5265 and arc 5266 and creates compound arc 5430 in step 4070. Step 4075 generates the delay value of 0, and other state values including the HDL source id for the selector. Step 4080 records that compound arc 5430 was created from arc 5266 and arc 5265, and step 4085 records node s 5425 s as the predecessor node and node 5440 z as the successor node. The next iteration of loop 4065 creates compound arc 5470 of FIG. 19 from arc 5270, arc 5271, and arc 5272 in a similar fashion. Likewise, other arcs emanating from merged nodes are created.

Once the compound nodes and arcs are created, loop 4090 loops over the non-merged nodes in the active node array and loop 4095 disconnects arcs that point from unmerged nodes to merged nodes in step 4100. For example, arc 5270 is disconnected from node 5110. Finally, loop 4110 loops over each compound arc and connects it. For example, step 4115 connects compound arc 5430 by adding it to compound node 5440's predecessor list, and to compound node 5425's successor list.

Figure 20:
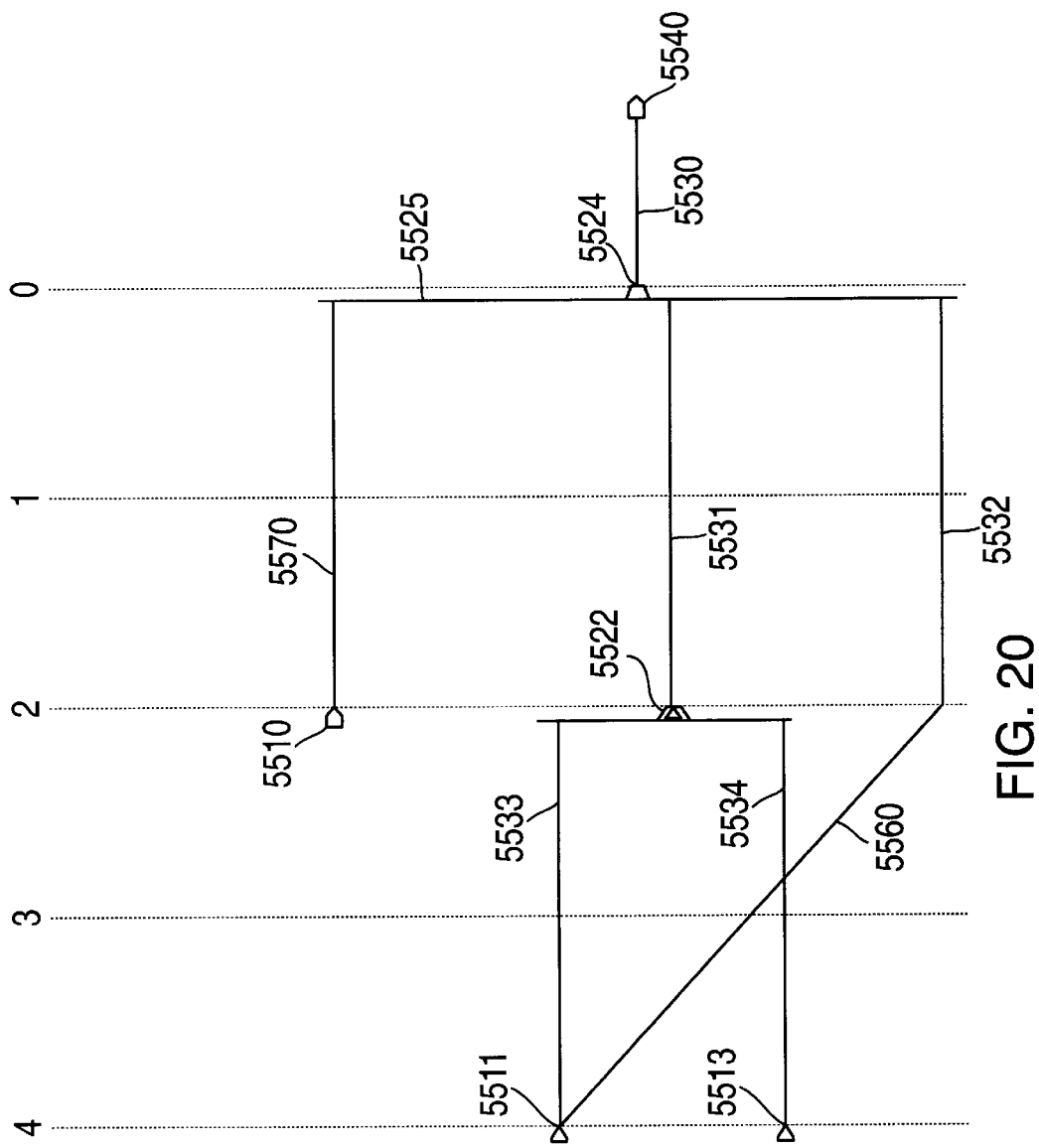
FIG. 20 is a sample delay chart laid out from the merged DAG of FIG. 19.

FIG. 20 is a sample delay chart laid out from the merged DAG of FIG. 19. Notice how this chart is simpler and easier to inspect.

Laying Out the DAG

Notice that DAG 5400 has global forward and backward root nodes added. These were added using the steps shown in FIG. 9. It will be apparent to one skilled in the art that in an alternate embodiment, these nodes need not be added if the layout methods are adjusted to process each startpoint and endpoint independently.

The delay chart shown in FIG. 20 is laid out using the methods shown in FIG. 10 through FIG. 11. In this example, the DAG is laid out from right-to-left. Step 3310 of FIG. 10(a) lays out the global forward root node and thus by recursion, all of its children. Thus, the steps of FIG. 10(b) are invoked to layout the nodes of the DAG. For example, node 5425 s is laid out at X=0 by step 3465 after the routine recurses through node 5410 enab at step 3440. When the routine returns to step 3450 to lay out node 5410 enab, XPerThisArc is set to 2 because the X for node 5440 s is 0 and the arc delay for arc 5470 is 2. When loop 3430 reaches node 5411 a, step 3440 will again recursively attempt to lay out node 5425 s, but its layout number will have been set to the global layout number in step 3415 previously, so the routine will skip to the end at step 3410. Likewise, the X values of all of the nodes are computed.

Next, the Y values of the arcs are computed by starting with Global.BkwdRootNode in step 3325 of FIG. 10(a) and using the steps shown in FIG. 10(c) and FIG. 10(d). For example, the routine recurses to compute the Y value of arc 5470 which is drawn as line 5570 in FIG. 20. After the Y value is computed in step 3665 of FIG. 10(c), the next available Y value is incremented in step 3670. Subsequently, when the routine is called again, arc 5433, which is drawn as line 5533 on FIG. 20, is laid out lower on the chart in step 3665.

Once all of the X and Y values have been calculated, the steps of FIG. 11 are invoked to draw the nodes recursively. Step 3050 of FIG. 7 displays the DAG using the steps shown in FIG. 11 to draw the global backward root node and its children. The root node is not drawn. In one embodiment, if the nodes adjacent to the root node also have a zero length arc feeding them, they are drawn as a special case at −0.9. Thus symbol 5540 is drawn at -0.9 to represent node 5440 in step 3725. Next, line 5530 is drawn to represent arc 5430 in step 3745. Likewise, symbol 5525 and vertical line 5526 are drawn in step 3725 to represent node 5425. The X value for the line and symbol are "0" as derived from node 5425 in step 3725. The Y range extends from the Y of top arc 5470 (drawn as line 5570) to the Y of bottom arc 5432 (drawn as line 5532).

Loop 3730 processes each arc connected to node 5425. When arc 5431 is processed it is drawn as line 5531 by step 3745 at the Y value of arc 5431 and from the X of node 5425, "0", to the X of node 5425 plus the arc delay of arc 5431, "2". Since arc 5431 is connected to node 5422, and node 5422's connected arc is arc 5431, step 3755 recursively calls draw node to draw node 5422. On a subsequent iteration of loop 3730, arc 5432 is processed to draw line 5532 in step 3745. In addition, diagonal 5560 is drawn in step 3770 to connect line 5532 to symbol 5511. Symbol 5511 is drawn at X value 4 because arc 5433 forced it that far to the left. Thus, diagonal 5560 is necessary to indicate the connectivity of arc 5432 and node 5411.

g. Highlighting between HDL and Delay charts

The following paragraphs describe a feature that is implemented in certain embodiments of the invention. It should be understood that the highlighting feature discussed below is not always a part of software implementing the present invention, but can be present in certain implementations. For example, it would be appropriate to implement the highlighting feature as a part of HDL debugging software, where the designer enters HDL and the system compiles the HDL to generate a circuit representation. In other implementations, the circuit representation is obtained from outside the system or the circuit representation is generated in a format not compatible with the highlighting feature. In such implementations, highlighting between the HDL code and delay chart may not be available.

Figure 21:
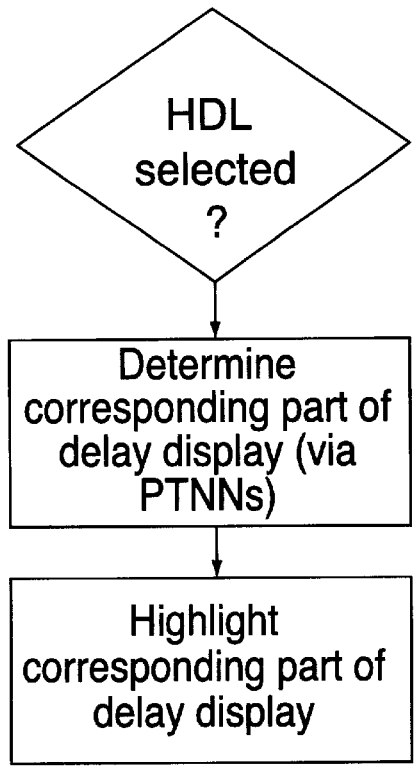
FIG. 21 is a flow chart of a method of highlighting portions of a delay chart in accordance with portions of HDL code highlighted by a designer.
Figure 22:
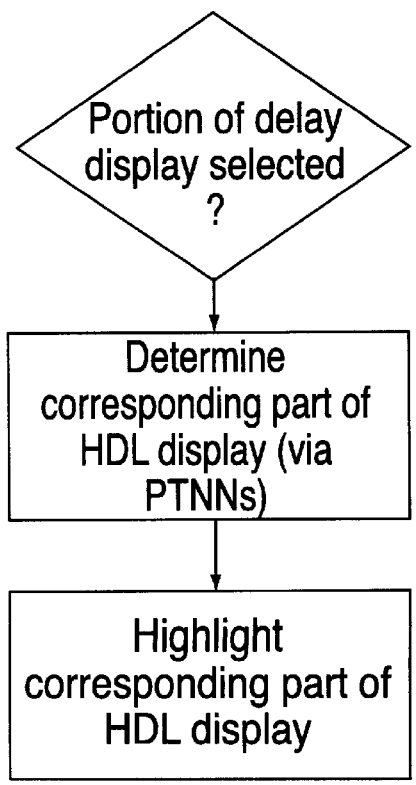
FIG. 22 is a flow chart of a method of highlighting portions of HDL code in accordance with portions of the delay chart highlighted by a designer.
Figure 23:
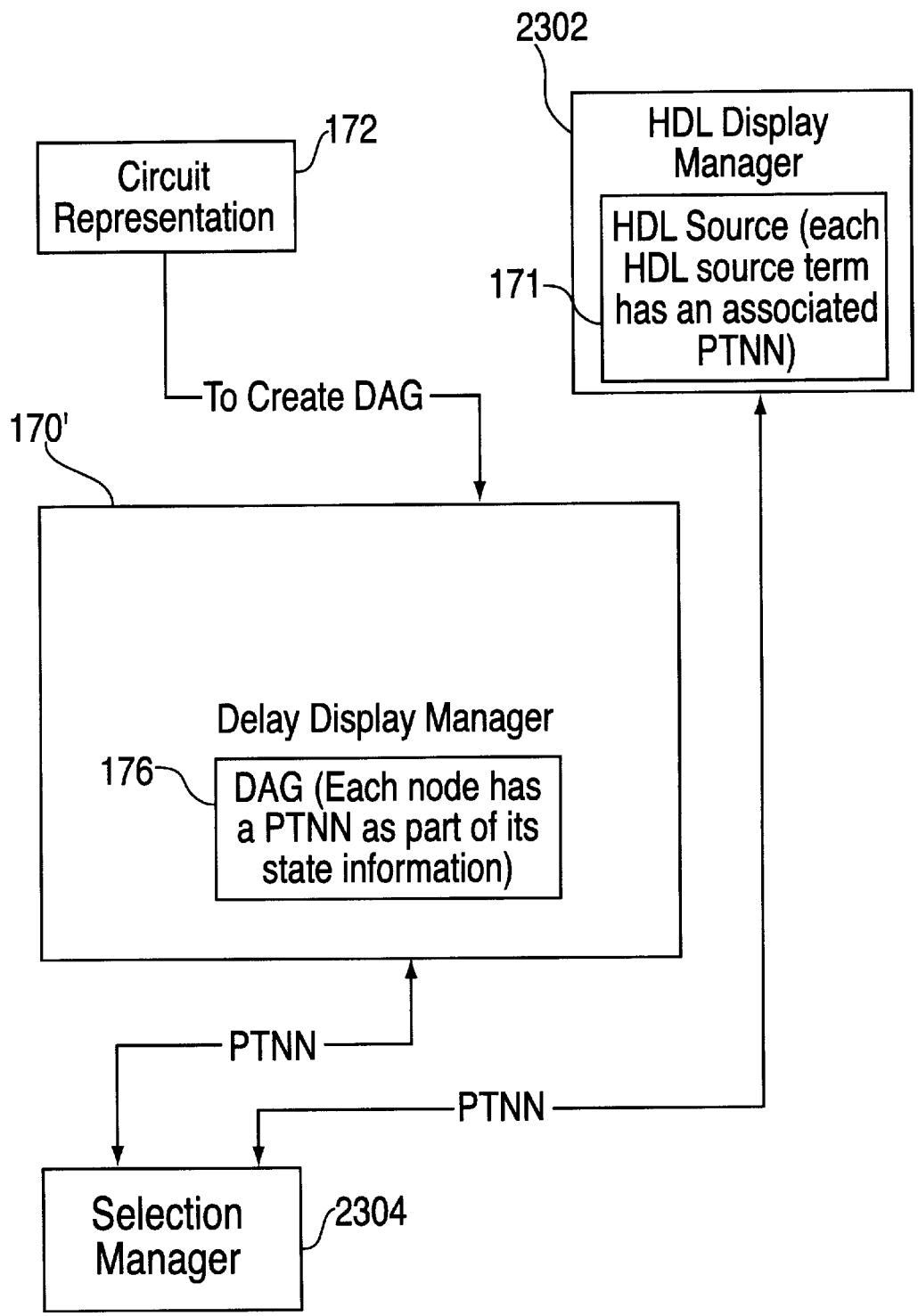
FIG. 23 is a block diagram showing how to highlight respective portions of the HDL and delay chart when a corresponding display is selected.

FIG. 21 is a flow chart of a method of highlighting portions of a delay chart in accordance with portions of HDL code highlighted by a designer. FIG. 22 is a flow chart of a method of highlighting portions of HDL code in accordance with portions of the delay chart highlighted by a designer. FIG. 23 is a diagram showing how display software 170 determines which portions of HDL correspond to which pins in the delay chart (and vice versa). With reference to FIG. 23, it is known how to compile HDL code 171. As described, for example, in co-pending application U.S. application Ser. No. 08/417,147 of Gregory et al., each portion of HDL code has a unique and corresponding parse tree node number (PTNN). An example of a circuit representation containing PTNNs is discussed in co-pending application U.S. application Ser. No. 08/417,147 of Gregory et al. (It should be understood, however, that the co-pending application does not discuss the generation or use of delay charts.)

In the described embodiment of the present invention, when display software 170 creates a DAG 176 from circuit representation 172, as described above, the PTNNs in each cell of the circuit representation are retained as state information of the corresponding DAG nodes (and/or arcs). Thus, it is possible to trace the relationship between a specific portion of HDL code and a specific portion of the displayed delay chart (and vice versa).

As shown in the flow chart of FIG. 22, if the designer selects a portion of displayed delay chart, display software 170 determines which DAG node or nodes corresponds to the selected delay chart portion and causes a corresponding portion of the HDL to be highlighted. Specifically, software 170 passes PTNN(s) that are state information of the selected DAG node(s) to a Selection Manager 2304. Selection Manager 2304 passes the PTNN to an HDL Manager 2302, which uses the PTNN to display a corresponding portion of the HDL source on the display device.

As shown in the flow chart of FIG. 21, if the designer selects a portion of displayed HDL code, the HDL Manager 2204 determines which PTNNs correspond to the selected HDL and causes a corresponding portion of the displayed delay chart to be highlighted. Specifically, HDL Manager 2302 passes PTNN(s) for the selected HDL to Selection Manager 2304. The Selection Manager passes the PTNN to display software 170, which uses the PTNN to highlight a corresponding portion of the delay chart in accordance with the DAG(s) having the PTNN(s) in their state info.

h. Unit Delay Charts

Figure 24:
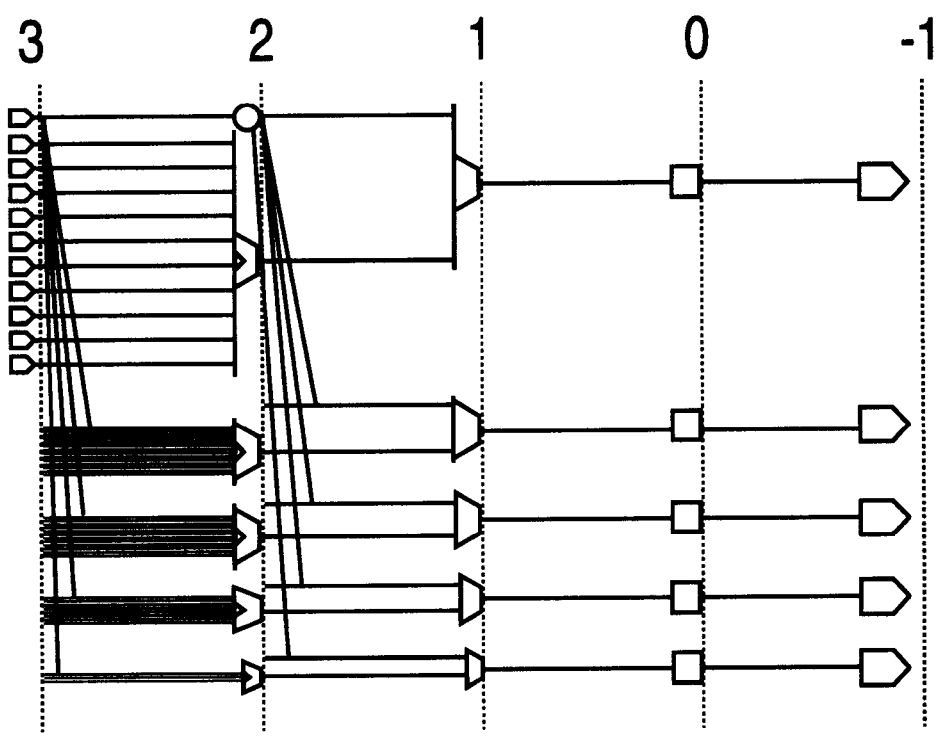
FIG. 24 shows an example of a unit delay chart.

Although the main purpose of delay charts is to help debug timing problems, delay charts can also be useful for analyzing the connectivity of a design. In this case, when the circuit representation is loaded (or generated from HDL), the designer can specify that all delays are set to "one." This causes software 170 to produce a "unit delay chart," in which all delays are represented as having a length of "1" time unit. FIG. 24 shows an example of a unit delay chart. Note that the unit delay control cell and asgn cells are visible. A unit delay chart is generated in a manner similar to a regular delay chart, except that, when the DAG is generated, all delays on all arcs are set to one and it is not necessary to remove zero length paths. Because there are no zero delay segments, there are no hidden pins in a unit delay chart. Although there are no zero length arcs to remove, unit delay charts may still be merged as described above.

i. User interface

The display software creates a new delay chart in accordance with FIG. 7 whenever the designer indicates that a new chart should be created. A preferred embodiment of the present invention uses a well-known windowing interface that allows the designer to open windows to display one or more of the HDL code, the delay chart. The interface also allows the user to "select" elements from at least the displayed HDL and the displayed delay chart, using a mouse or some other appropriate selection device, as is well-known in the art. It is well known in the art how to generate windows and how to receive user input using pull-down menus and the like. In a preferred embodiment, the functions "Highlights to delay chart" and "Delay chart to Highlights" are initiated by menu items. Similarly, the function "Generate delay chart" is also initiated by a menu item.

j. Info Tip

Figure 25:
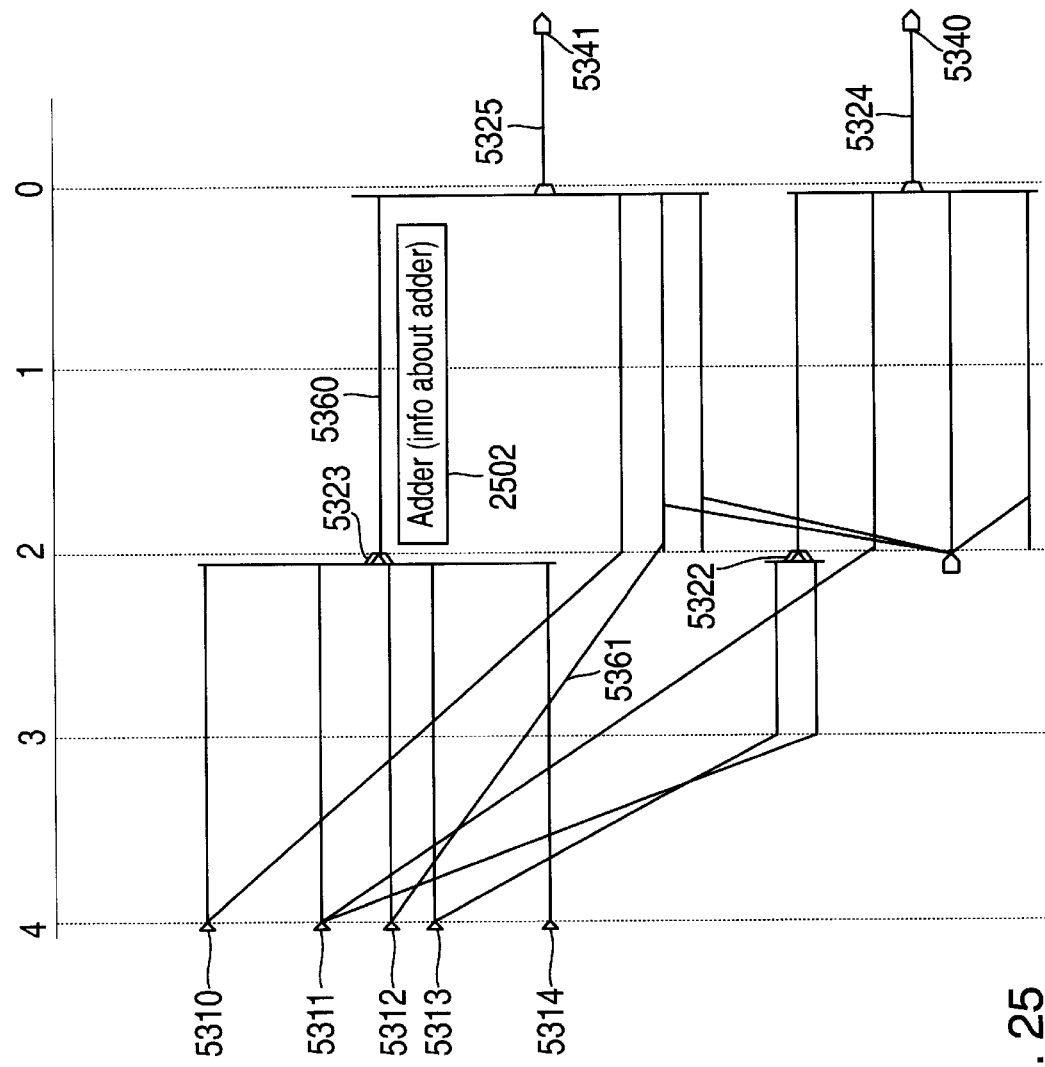
FIG. 25 shows the delay chart of FIG. 18, including a displayed info tip.

FIG. 25 shows the delay chart of FIG. 18, including a displayed info tip 2502. In the figure, the designer has indicated adder 5323 by leaving the cursor over the adder for a predetermined period of time or by moving the cursor over the adder and pushing a mouse button. This action by the designer results in a display of information about the adder being displayed next to the adder. The specific information contained in the info tip varies in different implementations of the invention, but can include, for example, the cell type ("adder"), the HDL source id, whether the adder represents merged nodes and which nodes were merged, etc. Some embodiments store the information in the info tip in the DAG node connected with the adder. Other implementations generate some or all of the information from the circuit representation 172. Similarly, in some implementations the info tip is not removed after the cursor is moved again. In other implementations, the info tip is displayed for a predetermined time.

Info tips can also be displayed for arcs. Arc information includes, for example, the name of the arc, its delay value, and whether the arc contains any hidden pins (and if, so, the names of the hidden pins).

k. Color by Highlight Mode

Figure 26:
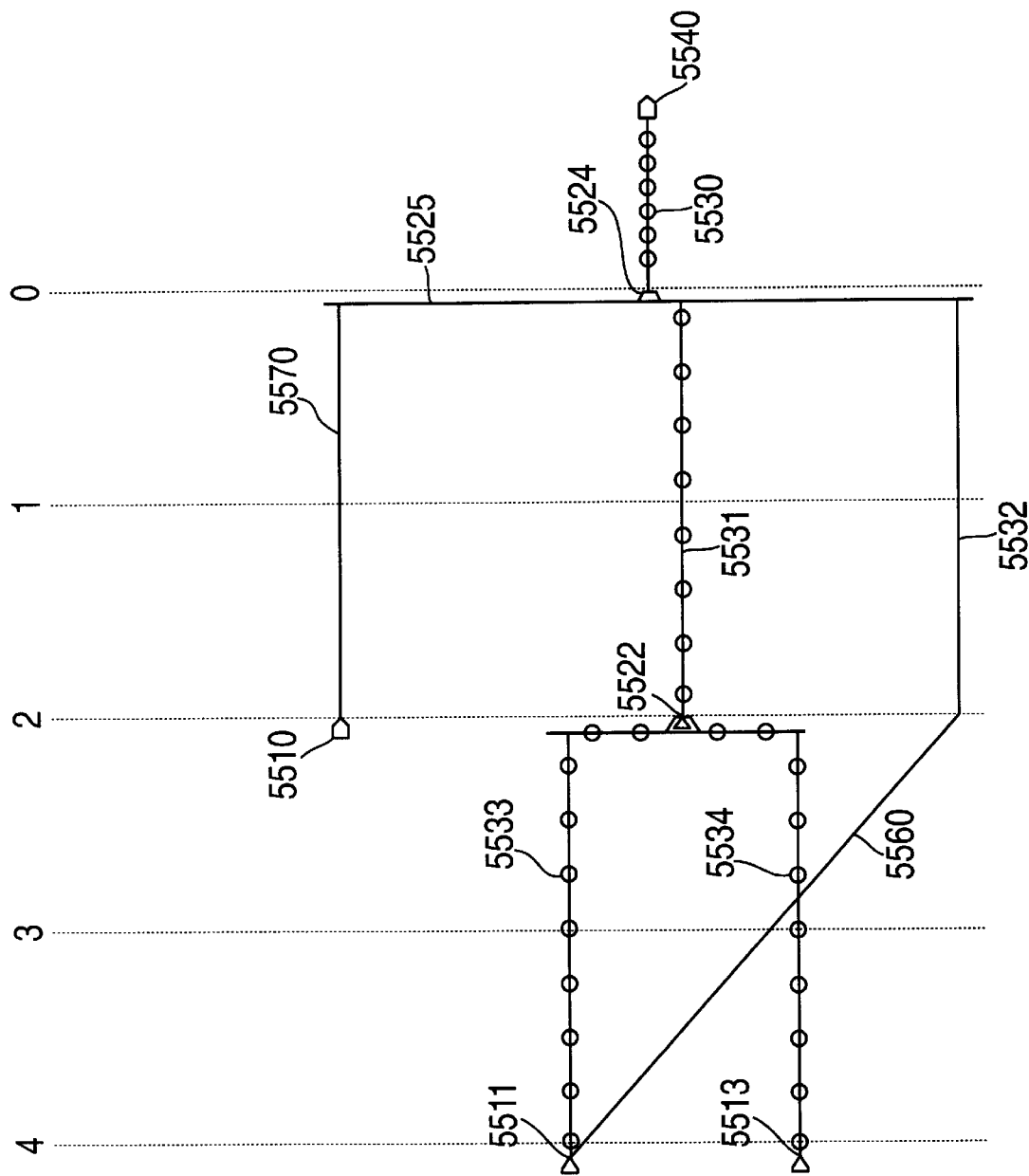
FIG. 26 shows the delay chart of FIG. 18, with a longest path and shortest path highlighted.

FIG. 26 shows the delay chart of FIG. 18, with nodes and arcs along paths having length greater than "3" highlighted. In the described embodiment, the designer indicates that nodes and arcs along paths greater than a certain length should be highlighted by clicking on a pull-down menu item "Color by Highlight," and then choosing a suitable path length from a dialog although any suitable method could be used to indicate the designer's choice of display mode. An alternate embodiment colors nodes and arcs along paths greater than a designer-specified percentage of the maximum path length through the DAG. To display a delay chart in Color By Highlight mode, software 170 traverses the DAG using standard timing analysis algorithms such as those employed by DesignTime which is available from Synopsys Inc. in Mountain View, Calif., to determine which nodes and arcs are on paths which have length greater than the specified value. Those nodes and arcs are then highlighted on the delay chart in a first color. All other nodes and arcs are colored in a second color. In FIG. 26, the first color is indicated by "O"s. As with all highlighted portions of the delay chart, the designer can choose to "select" any highlighted information via a pull-down menu item. The user can also select the converse of any highlighted information (i.e., "select all non-highlighted info").

l. Color by Pathlength Mode

Nodes and arcs can also be colored by pathlength. In this mode, software 170 determines the length of the longest and shortest paths through the DAG using standard timing analysis techniques. Software 170 then traverses the DAG and determines the length of the longest path through each node or arc in the DAG. Each node or arc is then colored on the display based on the longest path through it. For example, in one embodiment, nodes or arcs which are traversed by a path which has length 90% or greater of the maximum path length are colored red. Nodes or arcs which are only traversed by paths having length less than 10% of the minimum path length are colored in black. Other nodes and arcs are colored with other colors, based on the length of the longest path which passes through each node and arc. Note that the individual paths in the design are not enumerated, rather standard timing analysis algorithms which traverse the entire DAG simultaneously are used.

m. Color by Design Mode

In a preferred embodiment of the present invention, the state information in the nodes and/or arcs of the DAG includes information identifying the design of which the node/arc is a part. In Color by Design Mode, software 170 traverses the DAG and colors the nodes and arcs such that the nodes and arcs from each subdesign are colored with a unique color.

n. Pruning

Figure 27A:
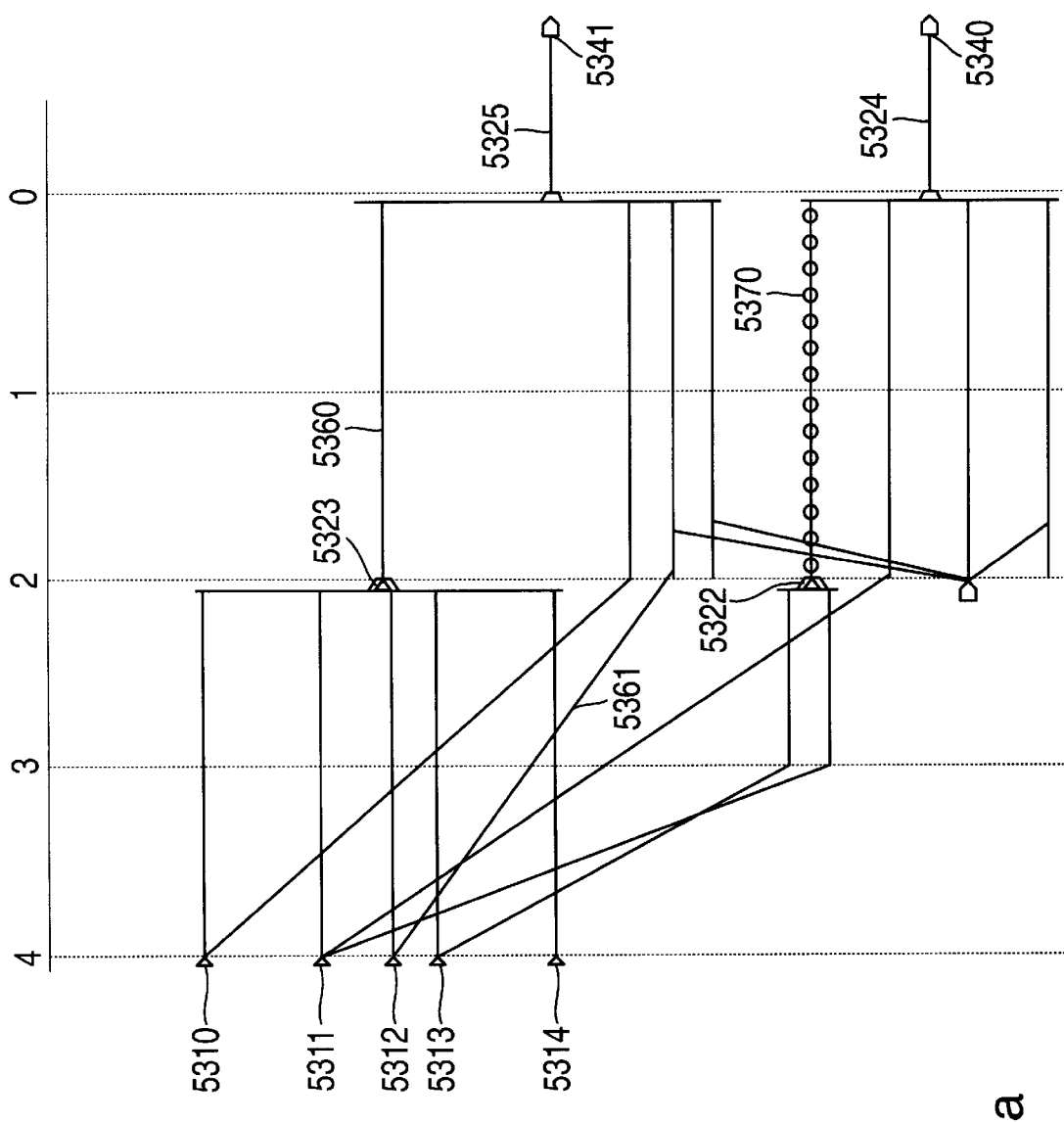

In a preferred embodiment, it is possible for the user to simplify the displayed delay chart by "pruning" nodes or arcs that are not currently of interest to the designer. FIGS. 27(a) and 27(b) show an example of a delay chart before and after pruning. In FIG. 27(a), the arc out of element 5322, indicated by line 5370 is selected. FIG. 27 (b) shows that the delay chart has been regenerated and displayed after the arc drawn as line 5370 is pruned. Note that by pruning this arc, a number of arcs and nodes are pruned. Pruning removes the selected objects, as well as any objects for which a path from startpoint to endpoint no longer exists after the selected objects are pruned. The designer can select nodes and/or arcs, e.g., using the mouse, and "prune" or remove those nodes and/or objects from the display. The designer can also select nodes and/or arcs by highlighting them, as described above, selecting the highlighted objects, and then "pruning" the selected objects. In the described embodiment, when a delay chart is pruned, it is simply regenerated without the pruned objects, as well as any other nodes or arcs which are no longer along a path between a startpoint and an endpoint after the pruned objects are removed, and redisplayed.

Figure 28:
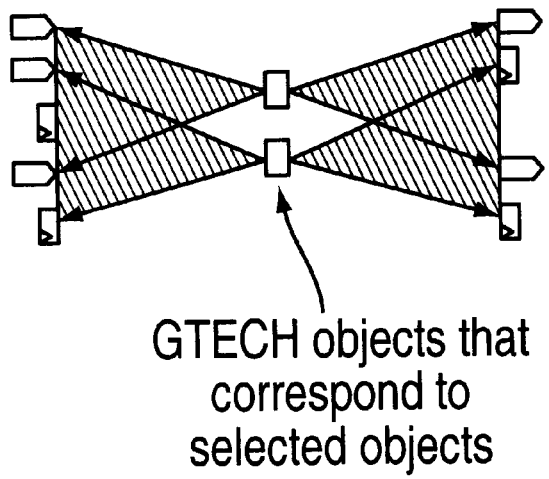
FIG. 28 shows an example of the fanin and fanout of a delay chart element selected.
Figure 29:
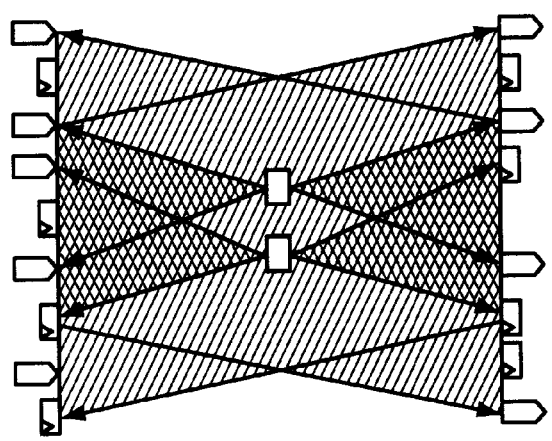
FIG. 29 shows an example of the fanin and fanout of the fanin and fanout of a delay chart element selected.

FIG. 28 shows an example of the fanin and fanout of a delay chart element highlighted. FIG. 29 shows an example of the fanin and fanout of the fanin and fanout of a delay chart element selected. The preferred embodiment allows the designer to choose either type of highlighting via pull-down menu.

In summary, the present invention graphically displays a circuit on a display screen so that the displayed lengths of paths of the circuit correspond to the delays of paths in the circuit. This graphic display is called a delay chart. The user can alter the display so that certain portions of the circuit are highlighted for easy comprehension. Similarly, the user can alter which portions of the circuit are displayed, so that only portions of interest are visible.

Other embodiments will be apparent to those skilled in the art from consideration of the specification and practice of the invention disclosed herein. It is intended that the specification and examples be considered as exemplary only, with a true scope of the invention being indicated by the following claims.

What is claimed is:

1. A method for graphic representation of circuit design and timing analysis, comprising the steps, performed by a data processing system, of:

providing a circuit representation stored in a memory of the data processing system, the circuit representation representing a circuit having at least one path with an associated delay;

generating a Directed Acyclic Graph (DAG) in the memory in accordance with the circuit representation; and displaying a delay chart on a display device in accordance with the DAG, wherein the delay chart represents the delay of the circuit Path graphically with an edge comprising a graphically distinct portion whose length is proportional to the delay, the delay chart including one or both of a right-to-left delay chart and a left-to-right delay chart, wherein the delay chart facilitates the design and timing analysis of the circuit.

2. The method of claim 1, where the displaying step represents the delay of the circuit as a horizontal line having a length proportional to the delay.

3. The method of claim 1, further including the steps of:

receiving input from a designer indicating that a portion of the delay chart is selected; and highlighting a portion of a hardware description language (HDL) code displayed on the display device in accordance with the input received by the designer, the highlighted HDL code portion corresponding to the selected portion of the delay chart.

4. The method of claim 3, further including the step, performed before the providing step, of generating the circuit representation in accordance with the HDL code, and wherein the highlighted HDL code is the HDL code that generated the portion of the DAG corresponding to the selected portion of the delay chart.

5. The method of claim 1, further including the steps of:

receiving input from a designer indicating that a portion of HDL code displayed on a display device is selected; and highlighting a portion of delay chart in accordance with the input received by the user, where the portion of highlighted delay chart corresponds to the selected portion of the HDL code.

6. The method of claim 5, further including the step, performed before the providing step, of generating the circuit representation in accordance with the HDL code, and wherein the selected HDL code is the HDL code that generated the portion of the DAG corresponding to the highlighted portion of the delay chart.

7. The method of claim 1, wherein the right-to-left delay chart represents a time to an end point, and wherein the left-to-right delay chart represents another time from a start point.

8. The method of claim 1, wherein the graphically distinct portion is displayed horizontally or vertically with respect to a visual view of a circuit designer.

9. The method of claim 1, wherein the edge graphically couples a first node to a second node and the second node is represented by a graphical element comprising a linear edge aligned with a time period.

10. The method of claim 9, wherein the edge has an end graphically coincident to the linear edge and wherein the graphically distinct portion of the edge is perpendicular to the linear edge.

11. The method of claim 1, wherein the graphically distinct portion of the edge is indicated as separate from a remainder portion of the edge by having the graphically distinct portion have a slope different from a slope of the remainder portion.

12. The method of claim 11, wherein the slope of the graphically distinct portion is set such that it is parallel to a time axis and the slope of the remainder portion is set such that it is at a diagonal to the time axis.

13. The method of claim 1, further comprising:

displaying a right-to-left delay chart along a time axis and relative to an end point, wherein the edge graphically couples a first node to a second node, wherein a second edge, representing a second delay of a second circuit path, graphically couples a third node to the first node and has a graphically distinct portion whose length is proportional to the delay, wherein a first end of the graphically distinct portion of the edge is further from the end point than a second end of the graphically distinct portion of the second edge and wherein a graphical element representing the first node is graphically connected to the first end and is graphically coupled, through another graphically distinct portion of the second edge, to the second end.

14. The method of claim 1, further comprising:

displaying a left-to-right delay chart along a time axis and relative to a start point, wherein the edge graphically couples a first node to a second node, wherein a second edge, representing a second delay of a second circuit path, graphically couples a third node to the first node and has a graphically distinct portion whose length is proportional to the delay, wherein a first end of the graphically distinct portion of the edge is further from the start point than a second end of the graphically distinct portion of the second edge and wherein a graphical element representing the first node is graphically connected to the first end and is graphically coupled, through another graphically distinct portion of the second edge, to the second end.

15. An apparatus for graphic representation of circuit design and timing analysis in a data processing system, comprising:

a first portion configured to provide a circuit representation stored in a memory of the data processing system, the circuit representation representing a circuit having at least one path with an associated delay;

a second portion coupled to the first portion and configured to generate a Directed Acyclic Graph (DAG) in the memory in accordance with the circuit representation; and a third portion coupled to the second portion and configured to display the graphic representation including in the form of a delay chart in accordance with the DAG, the delay chart representing the delay of the circuit Path graphically with an edge comprising a graphically distinct portion whose length is proportional to the delay, the delay chart including one or both of a right-to-left delay chart and a left-to-right delay chart, wherein the delay chart facilitates the design and timing analysis of the circuit.

16. The apparatus of claim 15, in which the delay of the circuit is represented as a horizontal line having a length proportional to the delay.

17. The apparatus of claim 15, further including:

a fourth portion coupled to the first portion and configured to generate, before the first portion provides, a representation of the circuit in accordance with a hardware description language (HDL) code, the HDL code being used for then generating the DAG.

18. The apparatus of claim 17, further including:

a fifth portion coupled to the third portion and configured to receive input from a designer indicating that a portion of the delay chart is being selected; and a sixth portion coupled to the fifth portion and configured to highlight in accordance with the input received from the designer a portion of the HDL code being displayed, the highlighted HDL code portion corresponding to the selected portion of the delay chart.

19. The apparatus of claim 17, further including:

a fifth portion coupled to the third portion and configured to receive input from a designer indicating that a portion of the HDL code being displayed is being selected; and a sixth portion coupled to the fifth portion and configured to highlight in accordance with the input received from the designer a portion of the delay chart being displayed, the highlighted portion corresponding to the selected portion of the HDL code.

20. The apparatus of claim 17, further including:

a fifth portion coupled to the third portion and configured to receive input from a designer indicating that a portion of one of the HDL code and the delay chart being displayed is being selected; and a sixth portion coupled to the fifth portion and configured to highlight in accordance with the input received from the designer one of a portion of the delay chart which corresponds to the HDL code portion being selected and a portion of the HDL code which corresponds to the delay chart portion being selected.

21. The apparatus of claim 15, in which the right-to-left delay chart represents a time to an end point, and wherein the left-to-right delay chart represents another time from a start point.

22. An apparatus for graphic representation of circuit design and timing analysis in a data processing system, comprising:

means for providing a circuit representation stored in a memory of the data processing system, the circuit representation representing a circuit having at least one path with an associated delay;

means coupled to the providing means for generating a [Direct] Directed Acyclic Graph (DAG) in the memory in accordance with the circuit representation; and means coupled to the generating means for displaying the graphic representation including in the form of a delay chart in accordance with the DAG, the delay chart representing the delay of the circuit path graphically with an edge comprising a graphically distinct portion whose length is proportional to the delay, the delay chart including one or both of a right-to-left delay chart and a left-to-right delay chart, wherein the delay chart facilitates the design and timing analysis of the circuit.

23. The apparatus of claim 22, in which the delay of the circuit is represented as a horizontal line having a length proportional to the delay.

24. The apparatus of claim 22, further including:

means coupled to the providing means for generating, before providing, a representation of the circuit in accordance with a hardware description language (HDL) code, the HDL code being used for then generating the DAG.

25. The apparatus of claim 24, further including:

means coupled to the display means for receiving input from a designer indicating that a portion of the delay chart is being selected; and means coupled to the receiving means for highlighting in accordance with the input received from the designer a portion of the HDL code being displayed, the highlighted HDL code portion corresponding to the selected portion of the delay chart.

26. The apparatus of claim 24, further including:

means coupled to the display means for receiving input from a designer indicating that a portion of the HDL code being displayed is being selected; and means coupled to the receiving means for highlighting in accordance with the input received from the designer a portion of the delay chart being displayed, the highlighted portion corresponding to the selected portion of the HDL code.

27. The apparatus of claim 24, further including:

means coupled to the display means for receiving input from a designer indicating that a portion of one of the HDL code and the delay chart which is being displayed is being selected; and means coupled to the receiving means for highlighting in accordance with the input received from the designer one of a portion of the delay chart which corresponds to the HDL code portion being selected and a portion of the HDL code which corresponds to the delay chart portion being selected.

28. The apparatus of claim 22, in which the right-to-left delay chart represents a time to an end point, and wherein the left-to-right delay chart represents another time from a start point.

29. A computer readable medium including instructions for graphic representation of circuit design and timing analysis in a data processing system, the instructions for:

provided a circuit representation stored in a memory of the data processing system, the circuit representation representing a circuit having at least one path with an associated delay;

generating a Directed Acyclic Graph (DAG) in the memory in accordance with the circuit representation; and displaying the graphic representation including in the form of a delay chart in accordance with the DAG, the delay chart representing the delay of the circuit path graphically with an edge comprising a graphically distinct portion whose length is proportional to the delay, the delay chart including one or both of a right-to-left delay chart and a left-to-right delay chart, wherein the delay chart facilitates the design and timing analysis of the circuit.

30. The computer readable medium of claim 29, wherein the delay of the circuit is represented as a horizontal line having a length proportional to the delay.

31. The computer readable medium of claim 29, further including instructions for:

generating, before providing, a representation of the circuit in accordance with a hardware description language (HDL) code, the HDL code being used for then generating the DAG.

32. The computer readable medium of claim 31, further including instructions for:

receiving input from a designer indicating that a portion of the delay chart is being selected; and highlighting in accordance with the input received from the designer a portion of the HDL code being displayed, the highlighted HDL code portion corresponding to the selected portion of the delay chart.

33. The computer readable medium of claim 31, further including instructions for:

receiving input from a designer indicating that a portion of the HDL code being displayed is being selected; and highlighting in accordance with the input received from the designer a portion of the delay chart being displayed, the highlighted portion corresponding to the selected portion of the HDL code.

34. The computer readable medium of claim 31, further including instructions for:

receiving input from a designer indicating that a portion of one of the HDL code and the delay chart which is being displayed is being selected; and highlighting in accordance with the input received from the designer one of a portion of the delay chart which corresponds to the HDL code portion being selected and a portion of the HDL code which corresponds to the delay chart portion being selected.

35. The computer readable medium of claim 29, wherein the right-to-left delay chart represents a time to an end point, and wherein the left-to-right delay chart represents another time from a start point.

* * * * *